United States Patent
Otake et al.

(10) Patent No.: US 12,272,742 B2
(45) Date of Patent: Apr. 8, 2025

(54) NITRIDE SEMICONDUCTOR DEVICE

(71) Applicant: ROHM CO., LTD., Kyoto (JP)

(72) Inventors: Hirotaka Otake, Kyoto (JP); Kentaro Chikamatsu, Kyoto (JP); Minoru Akutsu, Kyoto (JP); Shinya Takado, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 624 days.

(21) Appl. No.: 17/605,442

(22) PCT Filed: Mar. 6, 2020

(86) PCT No.: PCT/JP2020/009799
§ 371 (c)(1),
(2) Date: Oct. 21, 2021

(87) PCT Pub. No.: WO2020/217735
PCT Pub. Date: Oct. 29, 2020

(65) Prior Publication Data
US 2022/0199820 A1    Jun. 23, 2022

(30) Foreign Application Priority Data

Apr. 25, 2019  (JP) .................. 2019-084320
Jan. 28, 2020  (JP) .................. 2020-011739

(51) Int. Cl.
*H01L 29/778*  (2006.01)
*H01L 29/20*  (2006.01)
*H01L 29/812*  (2006.01)

(52) U.S. Cl.
CPC ...... *H01L 29/7786* (2013.01); *H01L 29/2003* (2013.01); *H01L 29/812* (2013.01)

(58) Field of Classification Search
CPC ... H01L 29/122–127; H01L 29/15–158; H01L 29/66431; H01L 29/66462;
(Continued)

(56) References Cited

U.S. PATENT DOCUMENTS

| 6,567,443 B2 * | 5/2003 | Bour ................ B82Y 20/00 372/45.01 |
| 11,322,599 B2 | 5/2022 | Neufeld et al. |

(Continued)

FOREIGN PATENT DOCUMENTS

| JP | 2006339561 | 12/2006 |
| JP | 2008140812 | 6/2008 |

(Continued)

OTHER PUBLICATIONS

Office Action issued in corresponding Taiwanese Patent Application No. 109112321, Oct. 12, 2022, 36 pages w/translation.

(Continued)

*Primary Examiner* — Amar Movva
*Assistant Examiner* — Eric Manuel Mulero Flores
(74) *Attorney, Agent, or Firm* — XSENSUS LLP

(57) ABSTRACT

A nitride semiconductor device 1 includes a first nitride semiconductor layer that constitutes an electron transit layer, a second nitride semiconductor layer that is formed on the first nitride semiconductor layer, is larger in bandgap than the first nitride semiconductor layer, and constitutes an electron supply layer, a gate portion that is formed on the second nitride semiconductor layer, and a source electrode and a drain electrode that, on the second nitride semiconductor layer, are opposingly disposed across the gate portion. The gate portion includes a third nitride semiconductor layer of a ridge shape that is formed on the second nitride semiconductor layer and contains an acceptor type impurity and a gate electrode that is formed on the third nitride semiconductor layer. A film thickness of the third nitride semiconductor layer is greater than 100 nm.

20 Claims, 25 Drawing Sheets

(58) Field of Classification Search
CPC ......... H01L 29/778–7789; H01L 2924/13064; H01L 29/12–207; H01L 29/4983; H01L 29/36–365; H01L 21/28105
See application file for complete search history.

(56) References Cited

U.S. PATENT DOCUMENTS

| | | | |
|---|---|---|---|
| 11,600,721 B2* | 3/2023 | Otake | H01L 29/42316 |
| 2001/0017388 A1 | 8/2001 | Ponomarev | |
| 2003/0218183 A1 | 11/2003 | Micovic et al. | |
| 2006/0124962 A1 | 6/2006 | Ueda et al. | |
| 2006/0273347 A1* | 12/2006 | Hikita | H01L 29/66462 257/E29.252 |
| 2007/0290230 A1* | 12/2007 | Kawaguchi | H01L 33/04 257/E29.328 |
| 2008/0203471 A1 | 8/2008 | Otake et al. | |
| 2008/0296621 A1* | 12/2008 | Bridger | H01L 29/778 257/192 |
| 2009/0050938 A1 | 2/2009 | Miyoshi et al. | |
| 2010/0258841 A1 | 10/2010 | Lidow et al. | |
| 2010/0258843 A1 | 10/2010 | Lidow et al. | |
| 2010/0320505 A1 | 12/2010 | Okamoto et al. | |
| 2011/0095336 A1 | 4/2011 | Zundel et al. | |
| 2011/0233623 A1 | 9/2011 | Park et al. | |
| 2012/0248387 A1* | 10/2012 | Ooshika | C23C 16/303 252/521.5 |
| 2013/0056744 A1 | 3/2013 | Mishra et al. | |
| 2013/0234153 A1 | 9/2013 | Lidow et al. | |
| 2013/0240949 A1* | 9/2013 | Yamada | H01L 29/66462 257/190 |
| 2013/0320349 A1 | 12/2013 | Saunier et al. | |
| 2014/0008658 A1 | 1/2014 | Siemieniec et al. | |
| 2014/0050242 A1 | 2/2014 | Taylor | |
| 2014/0091319 A1* | 4/2014 | Yamada | H01L 29/66431 438/172 |
| 2014/0175455 A1* | 6/2014 | Tanimoto | H01L 29/778 438/197 |
| 2014/0183598 A1 | 7/2014 | Chiu et al. | |
| 2014/0203288 A1 | 7/2014 | Hsiung | |
| 2014/0252368 A1 | 9/2014 | Lee et al. | |
| 2014/0264450 A1 | 9/2014 | Chyi et al. | |
| 2014/0266324 A1 | 9/2014 | Teo et al. | |
| 2015/0162427 A1 | 6/2015 | Lee et al. | |
| 2015/0171202 A1 | 6/2015 | Takahashi | |
| 2015/0279982 A1 | 10/2015 | Yamamoto et al. | |
| 2015/0318387 A1 | 11/2015 | Chiu et al. | |
| 2016/0043210 A1 | 2/2016 | Curatola et al. | |
| 2016/0071967 A1 | 3/2016 | Prechtl et al. | |
| 2016/0254377 A1 | 9/2016 | Morancho et al. | |
| 2016/0343702 A1* | 11/2016 | Tomita | H01L 27/0605 |
| 2017/0104091 A1 | 4/2017 | Tanaka | |
| 2018/0033682 A1 | 2/2018 | Chern et al. | |
| 2018/0061975 A1 | 3/2018 | Tanaka | |
| 2018/0090472 A1 | 3/2018 | Disney | |
| 2018/0182880 A1 | 6/2018 | Grieb et al. | |
| 2018/0308968 A1 | 10/2018 | Miura et al. | |
| 2019/0081167 A1 | 3/2019 | Chen et al. | |
| 2019/0237551 A1 | 8/2019 | Tanaka | |

FOREIGN PATENT DOCUMENTS

| | | |
|---|---|---|
| JP | 2012523700 | 10/2012 |
| JP | 2014027187 | 2/2014 |
| JP | 2014140024 | 7/2014 |
| JP | 2015115371 | 6/2015 |
| JP | 2017073506 | 4/2017 |
| TW | 200305283 | 10/2003 |
| TW | 201044575 | 12/2010 |
| TW | 201044576 | 12/2010 |

OTHER PUBLICATIONS

Office Action issued in corresponding Taiwanese Patent Application No. 110129746, Oct. 12, 2022, 29 pages w/translation.

Japanese Office Action issued Mar. 16, 2024 in corresponding Japanese Patent Application No. 2021-515855, 19 pages.

International Preliminary Report on Patentability issued for International Patent Application No. PCT/JP2020/009799, Date of mailing: Nov. 4, 2021, 18 pages including English translation.

Ge, M. et al., "Gate Reliability of p-GaN Gate AlGaN/GaN High Electron Mobility Transistors," IEEE Electron Device Letters, vol. 40, No. 3, Mar. 2019, pp. 379-382.

Wu, Tian-Li et al., "Forward Bias Gate Breakdown Mechanism in Enhancement-Mode p-GaN Gate AlGaN/GaN High-Electron Mobility Transistors," IEEE Electron Device Letters, vol. 36, No. 10, Oct. 2015, pp. 1001-1003.

Meneghini, M. et al., "Gate Stability of GaN-Based HEMTs with P-Type Gate," Electronics, 5, 14, 2016, 8 pages.

International Search Report and Written Opinion issued for International Patent Application No. PCT/JP2020/009799, Date of mailing: May 26, 2020, 14 pages including English translation of Search Report.

Office Action issued Jul. 25, 2024 in corresponding Japanese Patent Application No. 2021-515855.

* cited by examiner

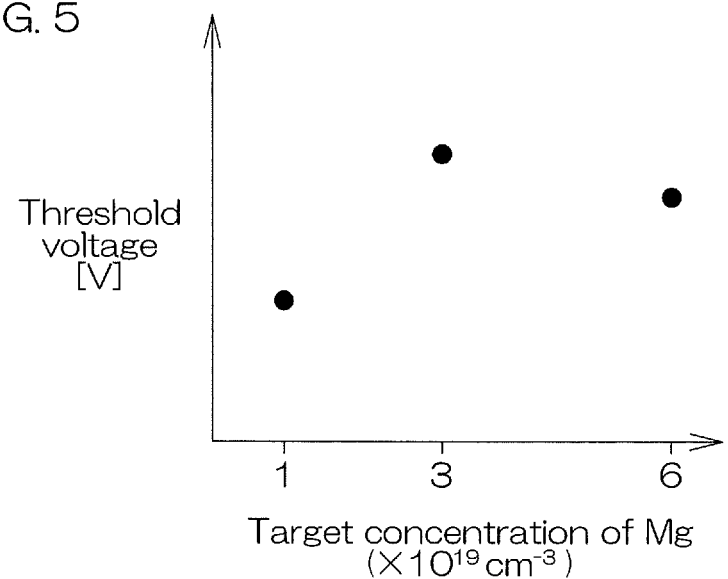

1D

1E

NITRIDE SEMICONDUCTOR DEVICE

TECHNICAL FIELD

The present invention relates to a nitride semiconductor device that is constituted of a group III nitride semiconductor (hereinafter referred to at times simply as "nitride semiconductor").

BACKGROUND ART

A group III nitride semiconductor is a semiconductor among group III-V semiconductors with which nitrogen is used as the group V element. Aluminum nitride (AlN), gallium nitride (GaN), and indium nitride (InN) are representative examples thereof. It can generally be expressed as $Al_xIn_yGa_{1-x-y}N$ ($0 \leq x \leq 1$, $0 \leq y \leq 1$, $0 \leq x+y \leq 1$).

An HEMT (high electron mobility transistor) using such a nitride semiconductor has been proposed. Such an HEMT includes, for example, an electron transit layer constituted of GaN and an electron supply layer constituted of an AlGaN epitaxially grown on the electron transit layer. A pair of source electrode and drain electrode are formed such as to contact the electron supply layer and a gate electrode is disposed therebetween.

Due to polarization caused by lattice mismatch of GaN and the AlGaN, a two-dimensional electron gas is formed at a position inside the electron transit layer that is only a few Å inward from an interface between the electron transit layer and the electron supply layer. A source and a drain are connected to each other with the two-dimensional electron gas as a channel. When the two-dimensional electron gas is interrupted by application of a control voltage to the gate electrode, the source and the drain are interrupted from each other. The source and the drain are made conductive to each other in a state where the control voltage is not applied to the gate electrode and therefore the device is of a normally-on type.

Devices using a nitride semiconductor have features of high withstand voltage, high temperature operation, high current density, high speed switching, and low on resistance and applications to power devices are thus being proposed, for example, in Patent Literature 1.

Patent Literature 1 discloses an arrangement where a p type GaN gate layer (nitride semiconductor gate layer) of a ridge shape is laminated on an AlGaN electron supply layer, a gate electrode is disposed thereon, and a channel is eliminated by a depletion layer spreading from the p type GaN gate layer to achieve a normally-off operation.

Also, with Patent Literature 2, in order to achieve the normally-off operation using a p type GaN layer gate layer, a high-concentration p type GaN layer and a gate electrode are put in ohmic connection. Due to the ohmic connection, the arrangement is an ohmic GIT (gate injection transistor) with which conductivity modulation is intended to be performed by making a current flow through the gate electrode and implanting holes to the high-concentration p type GaN layer.

CITATION LIST

Patent Literature

Patent Literature 1: Japanese Patent Application Publication No. 2017-73506
Patent Literature 2: Japanese Patent Application Publication No. 2006-339561

Non-Patent Literature 1: Tian-Li Wu et al., "Forward Bias Gate Breakdown Mechanism in Enhancement-Mode p-GaN Gate AlGaN/GaN High-Electron Mobility Transistors," IEEE Electron Device Letters, vol. 36, no. 10, pp. 1001-1003, 2015.
Non-Patent Literature 2: M. Meneghini et al., "Gate Stability of GaN-Based HEMTs with P-Type Gate," Electronics, vol. 5, no. 14, pp. 1-8, 2016.

SUMMARY OF INVENTION

Technical Problem

With all arrangements that have been made into a product as a normally-off type nitride semiconductor HEMT that uses a p type GaN gate layer, a positive direction maximum rated gate voltage $V_{GSS+}$ (here, meaning the maximum voltage applicable to a gate with stability), which is one of absolute maximum rating items, is low. Specifically, the positive direction maximum rated gate voltage $V_{GSS+}$ of these products is approximately +6 V. On the other hand, a gate drive voltage is approximately +5 V and the difference is only approximately 1 V.

Also, the normally-off type nitride semiconductor HEMT is an ultrahigh speed operation device of low gate charge $Q_G$, fixed gate-drain charge $Q_{GD}$, and high mutual conductance $g_m$ and therefore, a surge voltage of approximately +1 V is easily generated due to influences of slight parasitic inductances of gate control stages and power stages. A gate-source voltage (hereinafter referred to as the "gate voltage") may then exceed the maximum rated gate voltage.

Thus, in order to prevent the gate voltage from exceeding the maximum rated gate voltage, for example, a method of using a resistance of sufficiently high value as an external gate resistance is adopted. However, in this case, high-speed/high-frequency operation, which is a usage method that makes use of the advantages of the nitride semiconductor HEMT, cannot be performed.

Although the maximum rated gate voltage is mainly set based on the reliability of a high-temperature gate bias, significant improvement of the maximum rated gate voltage is impeded by a phenomenon where a gate leak current increases suddenly when a large positive bias is applied to the gate (see Non-Patent Literatures 1 and 2). The phenomenon where the gate leak current increases suddenly thus is called $I_G$ breakdown (gate breakdown) in Non-Patent Literatures 1 and 2.

An object of the present invention is to provide a nitride semiconductor device with which a positive direction maximum rated gate voltage can be increased.

Solution to Problem

A preferred embodiment of the present invention provides a nitride semiconductor device that includes a first nitride semiconductor layer that constitutes an electron transit layer, a second nitride semiconductor layer that is formed on the first nitride semiconductor layer, is larger in bandgap than the first nitride semiconductor layer, and constitutes an electron supply layer, a gate portion that is formed on the second nitride semiconductor layer, and a source electrode and a drain electrode that, on the second nitride semiconductor layer, are opposingly disposed across the gate portion, and where the gate portion includes a third nitride semiconductor layer of a ridge shape that is formed on the second nitride semiconductor layer and contains an acceptor type impurity and a gate electrode that is formed on the third nitride semiconductor layer and a film thickness of the third nitride semiconductor layer is greater than 100 nm.

With the present arrangement, a positive direction maximum rated gate voltage can be increased.

In the preferred embodiment of the present invention, a gate voltage of +8 V is within a guaranteed voltage range.

In the preferred embodiment of the present invention, an average concentration of the acceptor type impurity in a thickness direction upper half portion of the third nitride semiconductor layer is not more than $4\times10^{19}$ cm$^{-3}$.

In the preferred embodiment of the present invention, the film thickness of the third nitride semiconductor layer is not less than 110 nm.

In the preferred embodiment of the present invention, an average concentration of the acceptor type impurity in a thickness direction upper half portion of the third nitride semiconductor layer is not less than $1\times10^{19}$ cm$^{-3}$.

In the preferred embodiment of the present invention, in a thickness direction upper half portion of the third nitride semiconductor layer, there is a changing point at which a concentration of the acceptor type impurity decreases from a deep position side toward a shallower position side of the third nitride semiconductor layer and the changing point is within a range of down to a depth position of 20 nm from a front surface of the third nitride semiconductor layer.

In the preferred embodiment of the present invention, an average concentration of the acceptor type impurity in a thickness direction lower half portion of the third nitride semiconductor layer is not less than $5\times10^{18}$ cm$^{-3}$.

In the preferred embodiment of the present invention, an average concentration of the acceptor type impurity in a thickness direction lower half portion of the third nitride semiconductor layer is not less than $7\times10^{18}$ cm$^{-3}$.

In the preferred embodiment of the present invention, a peak value of the acceptor type impurity in the thickness direction lower half portion of the third nitride semiconductor layer is not more than $3\times10^{19}$ cm$^{-3}$.

In the preferred embodiment of the present invention, the film thickness of the third nitride semiconductor layer is not less than 110 nm and not more than 150 nm.

In the preferred embodiment of the present invention, a gate voltage of +9 V is within a guaranteed voltage range.

In the preferred embodiment of the present invention, the first nitride semiconductor layer is constituted of a GaN layer, the second nitride semiconductor layer is constituted of an $Al \cdot Ga_{1-x}N$ ($0<x\leq1$) layer, and the third nitride semiconductor layer is constituted of an $Al_yGa_{1-y}N$ ($0\leq y<1$, $y<x$) layer.

In the preferred embodiment of the present invention, the acceptor type impurity is Mg.

In the preferred embodiment of the present invention, the acceptor type impurity is Zn.

In the preferred embodiment of the present invention, a film thickness of the second nitride semiconductor layer is not less than 15 nm.

In the preferred embodiment of the present invention, an Al composition x of the second nitride semiconductor layer is such that $x\leq0.15$.

In the preferred embodiment of the present invention, a film thickness of the second nitride semiconductor layer that is present directly below the source electrode and the drain electrode is thin in comparison to the film thickness of the second nitride semiconductor layer in other regions.

In the preferred embodiment of the present invention, Si is contained in the second nitride semiconductor layer that is present directly below the source electrode and the drain electrode.

In the preferred embodiment of the present invention, the gate electrode is in Schottky contact with the third nitride semiconductor layer.

In the preferred embodiment of the present invention, a fourth nitride semiconductor layer that is larger in bandgap than the third nitride semiconductor layer is formed on the third nitride semiconductor layer and the gate electrode is formed on the fourth nitride semiconductor layer.

In the preferred embodiment of the present invention, the fourth nitride semiconductor layer is an $Al_zGa_{1-z}N$ ($0\leq z<1$, $y<x\leq z$) layer.

In the preferred embodiment of the present invention, the gate electrode is in Schottky contact with the fourth nitride semiconductor layer.

In the preferred embodiment of the present invention, a fifth nitride semiconductor layer that is larger in bandgap than the second nitride semiconductor layer is formed at least in a region on the second nitride semiconductor layer between the second nitride semiconductor layer and the third nitride semiconductor layer.

In the preferred embodiment of the present invention, the fifth nitride semiconductor layer is an $Al_aGa_{1-a}N$ ($0\leq a<1$, $z\leq a$) layer.

In the preferred embodiment of the present invention, an average value of Al compositions per unit thickness across a total film thickness of the second nitride semiconductor layer and the fifth nitride semiconductor layer is substantially equal to an Al composition per unit thickness of the fourth nitride semiconductor layer.

In the preferred embodiment of the present invention, a film thickness of the fifth nitride semiconductor layer is thinner than a film thickness of the second nitride semiconductor layer.

In the preferred embodiment of the present invention, there is present a removed region in which the fifth nitride semiconductor layer in a region other than directly below the third nitride semiconductor layer of the ridge shape is removed partially or entirely in a thickness direction.

In the preferred embodiment of the present invention, the removed region is in each of regions below the source electrode and the drain electrode.

In the preferred embodiment of the present invention, Si is contained in at least one of either of the second nitride semiconductor layer and the fifth nitride semiconductor layer that is present directly below the source electrode and the drain electrode.

In the preferred embodiment of the present invention, the removed region is in a vicinity of a bottom portion of the third nitride semiconductor layer of the ridge shape.

In the preferred embodiment of the present invention, the removed region corresponds to being an entire area other than directly below the third nitride semiconductor layer of the ridge shape.

In the preferred embodiment of the present invention, in plan view, both side edges of the gate electrode are receded further inward than corresponding side edges of the third nitride semiconductor layer.

In the preferred embodiment of the present invention, the third nitride semiconductor layer is constituted of a main body portion that is formed on the second nitride semiconductor layer and an upper protruding portion that is formed on a width intermediate portion of an upper surface of the main body portion, and the gate electrode is present above a top surface of the upper protruding portion.

In the preferred embodiment of the present invention, if an on resistance is $R_{ON}$ and a gate charge is $Q_G$, $R_{ON} \cdot Q_G$ is not more than 150 [mΩnc].

In the preferred embodiment of the present invention, $R_{ON} \cdot Q_G$ is not more than 90 [mΩnc].

In the preferred embodiment of the present invention, a threshold voltage is not less than 1 V.

In the preferred embodiment of the present invention, in plan view, both side edges of the gate electrode are receded further inward than corresponding side edges of the third nitride semiconductor layer, and if a distance between one side edge of the gate electrode and a corresponding side edge of the third nitride semiconductor layer is a first ledge width L1 and a distance between the other side edge of the gate electrode and a corresponding side edge of the third nitride semiconductor layer is a second ledge width L2, at least one of either of the first ledge width L1 and the second ledge width L2 is not less than 5 nm and not more than 110 nm.

In the preferred embodiment of the present invention, at least one of either of the first ledge width L1 and the second ledge width L2 is not less than 5 nm and not more than 55 nm.

In the preferred embodiment of the present invention, at least one of either of the first ledge width L1 and the second ledge width L2 is set such as to become smaller as the film thickness of the third nitride semiconductor layer becomes thicker.

In the preferred embodiment of the present invention, if the film thickness of the third nitride semiconductor layer is t [nm], at least one width $L_i$ (i=1 or 2) of either of the first ledge width L1 [nm] and the second ledge width L2 [nm] satisfies the condition of the following formula (a).

$$5 \leq L_i \leq 55 \cdot [1 - \{(t - 100)/200\}] \tag{a}$$

In the preferred embodiment of the present invention, in plan view, both side edges of the gate electrode are receded further inward than corresponding side edges of the third nitride semiconductor layer, and if a distance between one side edge of the gate electrode and a corresponding side edge of the third nitride semiconductor layer is a first ledge width L1, a distance between the other side edge of the gate electrode and a corresponding side edge of the third nitride semiconductor layer is a second ledge width L2, and a sum of the first ledge width L1 and the second ledge width L2 is a total ledge width L, the total ledge width L is not less than 10 nm and not more than 220 nm.

In the preferred embodiment of the present invention, the total ledge width L is not less than 10 nm and not more than 110 nm.

In the preferred embodiment of the present invention, the total ledge width L is set such as to become smaller as the film thickness of the third nitride semiconductor layer becomes thicker.

In the preferred embodiment of the present invention, if the film thickness of the third nitride semiconductor layer is t [nm], the total ledge width L [nm] satisfies the condition of the following formula (b).

$$10 \leq L \leq 110 \cdot [1 - \{(t - 100)/200\}] \tag{b}$$

In the preferred embodiment of the present invention, in plan view, both side edges of the gate electrode are receded further inward than corresponding side edges of the third nitride semiconductor layer, and if a distance between one side edge of the gate electrode and a corresponding side edge of the third nitride semiconductor layer is a first ledge width L1, a distance between the other side edge of the gate electrode and a corresponding side edge of the third nitride semiconductor layer is a second ledge width L2, and t is the film thickness of the third nitride semiconductor layer, at least one width $L_i$ (i=1 or 2) of either of the first ledge width L1 and the second ledge width L2 satisfies the condition of the following formula (c).

$$t/12 < L_i < t/2 \tag{c}$$

In the preferred embodiment of the present invention, in plan view, both side edges of the gate electrode are receded further inward than corresponding side edges of the third nitride semiconductor layer, and if a distance between one side edge of the gate electrode and a corresponding side edge of the third nitride semiconductor layer is a first ledge width L1, a distance between the other side edge of the gate electrode and a corresponding side edge of the third nitride semiconductor layer is a second ledge width L2, a sum of the first ledge width L1 and the second ledge width L2 is a total ledge width L, and t [nm] is the film thickness of the third nitride semiconductor layer, the total ledge width L [nm] satisfies the condition of the following formula (d).

$$t/6 < L < t \tag{d}$$

In the preferred embodiment of the present invention, the film thickness t of the third nitride semiconductor layer is not more than 150 nm.

In the preferred embodiment of the present invention, the film thickness t of the third nitride semiconductor layer is not less than 125 nm.

In the preferred embodiment of the present invention, a film thickness of the gate electrode is not less than 150 nm.

In the preferred embodiment of the present invention, a film thickness of the gate electrode is not less than 50 nm.

In the preferred embodiment of the present invention, a distance from a side edge of the third nitride semiconductor layer at the drain electrode side to the drain electrode is not more than 10 μm.

In the preferred embodiment of the present invention, a distance from a side edge of the third nitride semiconductor layer at the drain electrode side to the drain electrode is not more than 5 μm.

In the preferred embodiment of the present invention, the first nitride semiconductor layer is constituted of a GaN layer, the second nitride semiconductor layer is constituted of an $Al_xGa_{1-x}N$ (0<x≤1) layer, and the third nitride semiconductor layer is constituted of an $Al_yGa_{1-y}N$ (0≤y<1, y<x) layer.

In the preferred embodiment of the present invention, the acceptor type impurity is Mg or Zn.

In the preferred embodiment of the present invention, the gate electrode is in Schottky contact with the third nitride semiconductor layer.

In the preferred embodiment of the present invention, a rated gate-source voltage is not less than 8 V.

In the preferred embodiment of the present invention, a rated drain-source voltage is not more than 300 V.

In the preferred embodiment of the present invention, if an on resistance is $R_{ON}$ and a gate charge is $Q_G$, $R_{ON} \cdot Q_G$ is not more than 100 [mΩnc].

The aforementioned as well as yet other objects, features, and effects of the present invention will be made clear by the following description of the preferred embodiments made with reference to the accompanying drawings.

BRIEF DESCRIPTION OF DRAWINGS

FIG. 5 is a graph of threshold voltages of respective cases where a target concentration of Mg added to the third nitride semiconductor layer is $1\times10^{19}$ cm$^{-3}$, $3\times10^{19}$ cm$^{-3}$, and $6\times10^{19}$ cm$^{-3}$.

DESCRIPTION OF EMBODIMENTS

Figure 1:
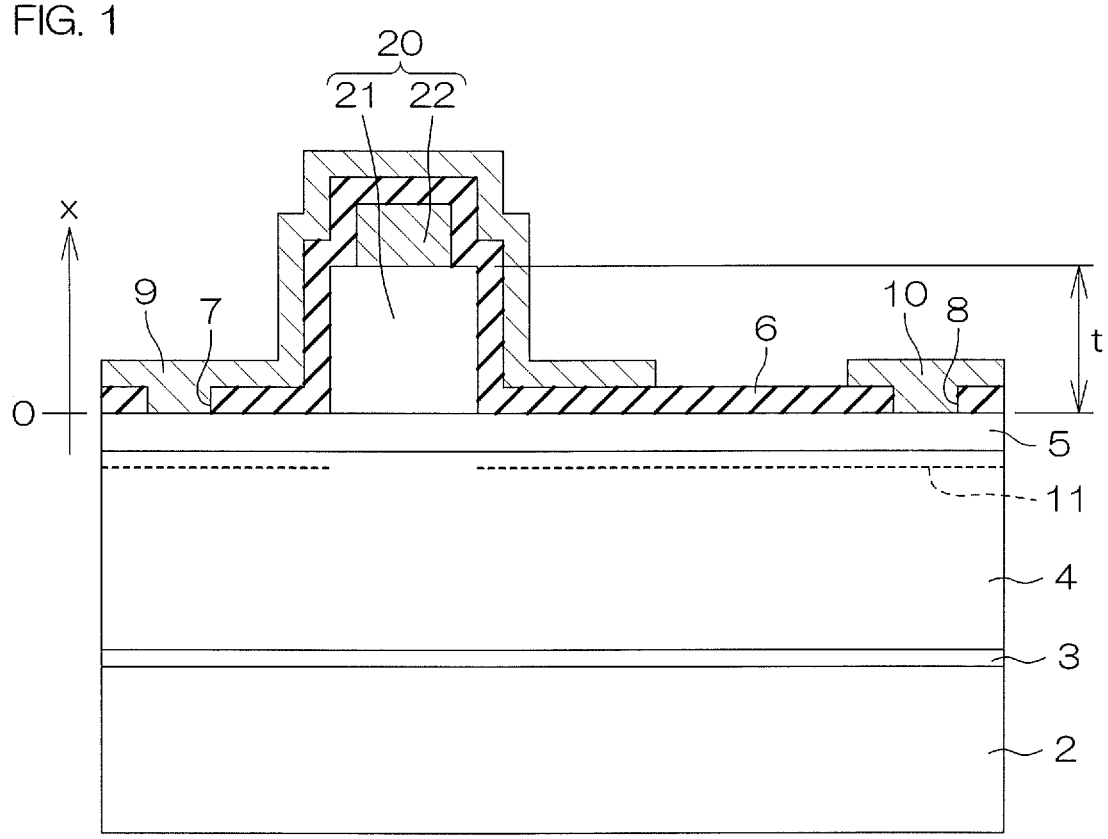
FIG. 1 is a sectional view for describing the arrangement of a nitride semiconductor device according to a first preferred embodiment of the present invention.

FIG. 1 is a sectional view for describing the arrangement of a nitride semiconductor device according to a first preferred embodiment of the present invention.

The nitride semiconductor device 1 includes a substrate 2, a buffer layer 3 that is formed on a front surface of the substrate 2, a first nitride semiconductor layer 4 that is epitaxially grown on the buffer layer 3, a second nitride semiconductor layer 5 that is epitaxially grown on the first nitride semiconductor layer 4, and a gate portion 20 that is formed on the second nitride semiconductor layer 5.

Further, the nitride semiconductor device 1 includes a passivation film 6 that covers the second nitride semiconductor layer 5 and the gate portion 20. Further, the nitride semiconductor device 1 includes a source electrode 9 and a drain electrode 10 that penetrate through a source contact hole 7 and a drain contact hole 8 formed in the passivation film 6 and are in ohmic contact with the second nitride semiconductor layer 5. The source electrode 9 and the drain electrode 10 are disposed at an interval. The source electrode 9 is formed such as to cover the gate portion 20.

The substrate 2 may, for example, be a silicon substrate of low resistance. The silicon substrate of low resistance may be a p type substrate having an electric resistivity of, for example, 0.001 Ωmm to 0.5 Ωmm (more specifically, approximately 0.01 Ωmm to 0.1 Ωmm). Also, besides a silicon substrate of low resistance, the substrate 2 may instead be an SiC substrate of low resistance, a GaN substrate of low resistance, etc. The substrate 2 has a thickness, for example, of approximately 650 μm during a semiconductor process and is ground to not more than approximately 300 μm in a preliminary stage before being made into a chip. The substrate 2 is electrically connected to the source electrode 9.

In this preferred embodiment, the buffer layer 3 is constituted of a multilayer buffer layer in which a plurality of nitride semiconductor films are laminated. In this preferred embodiment, the buffer layer 3 is constituted of a first buffer layer (not shown) constituted of an AlN film in contact with the front surface of the substrate 2 and a second buffer layer (not shown) constituted of an AlN/AlGaN superlattice layer laminated on a front surface of the first buffer layer (front surface at an opposite side to a substrate 2 side). A film thickness of the first buffer layer is approximately 100 nm to 500 nm. A film thickness of the second buffer layer is approximately 500 nm to 2 μm. The buffer layer 3 may instead be constituted, for example, of a single film or a composite film of AlGaN or of an AlGaN/GaN superlattice film.

The first nitride semiconductor layer 4 constitutes an electron transit layer. In this preferred embodiment, the first nitride semiconductor layer 4 is constituted of a GaN layer and a thickness thereof is approximately 0.5 μm to 2 μm. Also, an impurity by which a region other than a front surface region is made semi-insulating may be introduced for a purpose of suppressing a leak current that flows through the first nitride semiconductor layer 4. In this case, a concentration of the impurity is preferably not less than $4 \times 10^{16}$ cm$^{-3}$. Also, the impurity is, for example, C or Fe.

The second nitride semiconductor layer 5 constitutes an electron supply layer. The second nitride semiconductor layer 5 is constituted of a nitride semiconductor with a larger bandgap than the first nitride semiconductor layer 4. Specifically, the second nitride semiconductor layer 5 is constituted of a nitride semiconductor with a higher Al composition than the first nitride semiconductor layer 4. In a nitride semiconductor, the higher the Al composition, the larger the bandgap. In this preferred embodiment, the second nitride semiconductor layer 5 is constituted of an $Al_xGa_{1-x}N$ layer (0<x≤1). A value of x is preferably 10% to 30% and more preferably 10% to 15%. A thickness of the second nitride semiconductor layer 5 is preferably 5 nm to 25 nm and more preferably 15 nm to 25 nm.

The first nitride semiconductor layer (electron transit layer) 4 and the second nitride semiconductor layer (electron supply layer) 5 are thus constituted of nitride semiconductors that differ in bandgap (Al composition) and a lattice mismatch occurs therebetween. Also, due to spontaneous polarizations of the first nitride semiconductor layer 4 and the second nitride semiconductor layer 5 and a piezo polarization due to the lattice mismatch between the two, an energy level of a conduction band of the first nitride semiconductor layer 4 at an interface between the first nitride semiconductor layer 4 and the second nitride semiconductor layer 5 is made lower than a Fermi level. Thereby, inside the first nitride semiconductor layer 4, a two-dimensional electron gas (2DEG) 11 spreads at a position close to the interface between the first nitride semiconductor layer 4 and the second nitride semiconductor layer 5 (for example, at a distance of only several Å from the interface).

The gate portion 20 includes a third nitride semiconductor layer (semiconductor gate layer) 21 of a ridge shape that is epitaxially grown on the second nitride semiconductor layer 5 and a gate electrode 22 that is formed on the third nitride semiconductor layer 21. The gate portion 20 is disposed biasedly toward the source contact hole 7.

The third nitride semiconductor layer 21 is constituted of a nitride semiconductor that is doped with an acceptor type impurity. More specifically, the third nitride semiconductor layer 21 is constituted of an $Al_yGa_{1-y}N$ (0≤y<1, y<x) layer that is doped with the acceptor type impurity. In this preferred embodiment, the third nitride semiconductor layer 21 is constituted of a GaN layer (p type GaN layer) that is doped with the acceptor type impurity. In this preferred embodiment, a lateral cross section of the third nitride semiconductor layer 21 has a rectangular shape that is long in a thickness direction.

The third nitride semiconductor layer 21 is provided to change a conduction band of an interface formed by the first nitride semiconductor layer 4 (electron transit layer) and the second nitride semiconductor layer 5 (electron supply layer) in a region directly below the gate portion 20 such that the two-dimensional gas 11 is not formed in the region directly below the gate portion 20 in a state in which a gate voltage is not applied.

In this preferred embodiment, the acceptor type impurity is Mg (magnesium). The acceptor type impurity may instead be Zn (zinc) or other acceptor type impurity besides Mg.

A film thickness of the third nitride semiconductor layer 21 is preferably greater than 100 nm and is more preferably not less than 110 nm. More preferably, the film thickness of the third nitride semiconductor layer 21 is not less than 110 nm and not more than 150 nm. The reason for these shall be described later. In this preferred embodiment, the film thickness of the third nitride semiconductor layer 21 is approximately 120 nm.

Figure 2A:
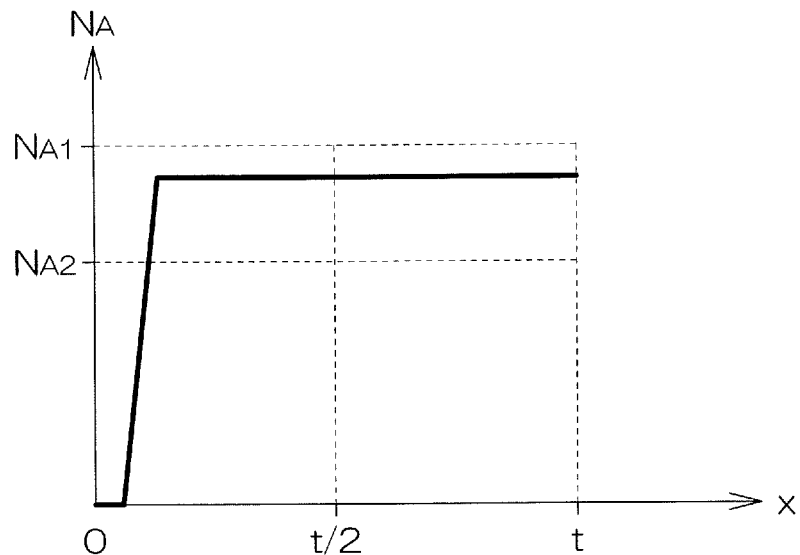
FIG. 2A is a graph of a setting example of a concentration of an acceptor type impurity versus a thickness direction position of a third nitride semiconductor layer.

FIG. 2A is a graph of a setting example of a concentration of the acceptor type impurity versus a thickness direction position of the third nitride semiconductor layer 21. As shown in FIG. 1, the thickness direction position of the third nitride semiconductor layer 21 is expressed by a distance x from a surface of the third nitride semiconductor layer 21 at a second nitride semiconductor layer 5 side (lower surface of the third nitride semiconductor layer 21).

In FIG. 2A, t expresses the film thickness of the third nitride semiconductor layer 21. In FIG. 2A, $N_{A1}$ is set to a value within a range of $3 \times 10^{19}$ cm$^{-3}$ to $4 \times 10^{19}$ cm$^{-3}$. $N_{A2}$ is set to a value within a range of $5 \times 10^{18}$ cm$^{-3}$ to $7 \times 10^{18}$ cm$^{-3}$.

In the example of FIG. 2A, due to using Mg as the acceptor type impurity, introduction of the acceptor type impurity is delayed by a memory effect and therefore close to where the thickness direction position x of the third nitride semiconductor layer 21 is 0, the concentration of the acceptor type impurity is 0. When the thickness direction position x of the third nitride semiconductor layer 21 increases from being close to 0, the acceptor type impurity concentration increases rapidly from 0 to an intermediate value between $N_{A1}$ and $N_{A2}$ as the thickness direction position x of the third nitride semiconductor layer 21 increases. In a region in which the thickness direction position x of the third nitride semiconductor layer 21 is not less than a position at which the acceptor type impurity concentration increased to the intermediate value between $N_{A1}$ and $N_{A2}$ but is less than t, the acceptor type impurity concentration is maintained at $N_{A2}$.

Here, the concentration of the acceptor type impurity versus the thickness direction position of the third nitride semiconductor layer 21 (the concentration profile) can be measured by secondary ion mass spectrometry (SIMS). However, the concentration of the acceptor type impurity at the surface of the third nitride semiconductor layer 21 at a gate electrode 22 side cannot be measured accurately and therefore, the measurement result of the acceptor type impurity at this surface is not used in a calculation of an average concentration of the acceptor type impurity.

An average concentration of the acceptor type impurity in a thickness direction upper half portion of the third nitride semiconductor layer 21 is preferably not more than $4 \times 10^{19}$ cm$^{-3}$. The average concentration of the acceptor type impurity at the thickness direction upper half portion of the third nitride semiconductor layer 21 is more preferably not more than $3 \times 10^{19}$ cm$^{-3}$. In this preferred embodiment, the average concentration of the acceptor type impurity at the thickness direction upper half portion of the third nitride semiconductor layer 21 is approximately $1 \times 10^{19}$ cm$^{-3}$ to $3 \times 10^{19}$ cm$^{-3}$.

The average concentration of the acceptor type impurity at the thickness direction lower half portion of the third nitride semiconductor layer 21 is preferably not less than $5 \times 10^{18}$ cm$^{-3}$. The average concentration of the acceptor type impurity at the thickness direction lower half portion of the third nitride semiconductor layer 21 is more preferably not less than $7 \times 10^{18}$ cm$^{-3}$.

Figure 2B:
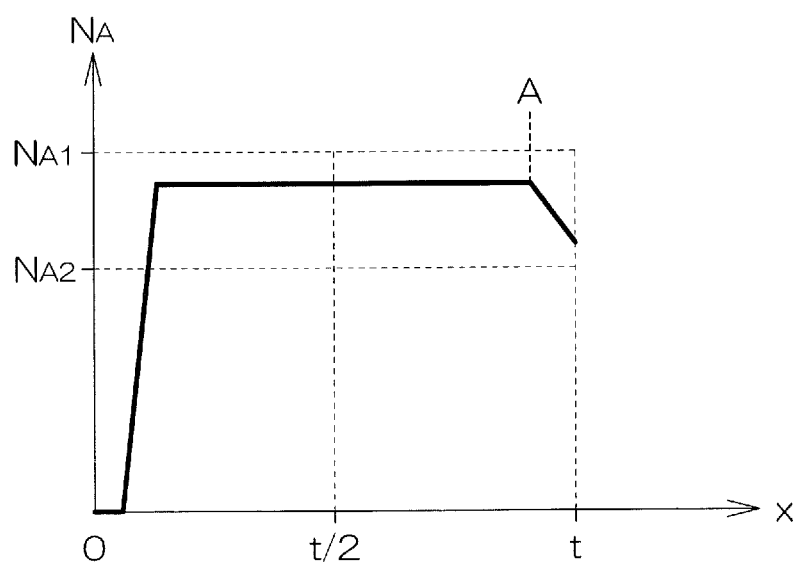
FIG. 2B is a graph of another setting example of the concentration of the acceptor type impurity versus the thickness direction position of the third nitride semiconductor layer.

Also, as shown in FIG. 2B, there may be a changing point A in the thickness direction upper half portion of the third nitride semiconductor layer 21 at which the concentration of the acceptor type impurity decreases from a deep position side toward a shallower position side of the third nitride semiconductor layer 21. The changing point A is preferably within a range of down to a depth position of 20 nm from a front surface of the third nitride semiconductor layer 21.

A lateral cross section of the gate electrode 22 has a laterally long rectangular shape. A width of the gate electrode 22 is narrower than a width of the third nitride semiconductor layer 21. The gate electrode 22 is formed on a width intermediate portion of an upper surface of the third nitride semiconductor layer 21. Therefore, a step is formed between an upper surface of the gate electrode 22 and an upper surface of one side portion of the third nitride semiconductor layer 21 and a step is formed between the upper surface of the gate electrode 22 and an upper surface of another side portion of the third nitride semiconductor layer 21. Also, in plan view, both side edges of the gate electrode 22 are receded further inward than corresponding side edges of the third nitride semiconductor layer 21.

In this preferred embodiment, the gate electrode is in Schottky contact with the upper surface of the third nitride semiconductor layer 21. The gate electrode 22 is constituted of TiN. A film thickness of the gate electrode 22 is approximately 50 nm to 150 nm. The gate electrode 22 may be constituted of a single film that is any one of a Ti film, a TiN film, and a TiW film or of a composite film constituted of any combination of two or more of the films.

The passivation film 6 covers a front surface of the second nitride semiconductor layer 5 (with the exception of regions facing the contact holes 7 and 8) and side surfaces and a front surface of the gate portion 20. A film thickness of the passivation film 6 is approximately 50 nm to 200 nm. In this preferred embodiment, the passivation film 6 is constituted of an SiN film. The passivation film 6 may instead be constituted of a single film that is any one of an SiN film, an SiO$_2$ film, an SiON film, an AL$_2$O$_3$ film, an AlN film, and an AlON film or of a composite film constituted of any combination of two or more of the films.

The source electrode 9 and the drain electrode are constituted, for example, of first metal layers (ohmic metal layers) that are in ohmic contact with the second nitride semiconductor layer 5, second metal layers (main electrode metal layers) that are laminated on the first metal layers, third metal layers (adhesion layers) that are laminated on the second metal layers, and fourth metal layers (barrier metal layers) that are laminated on the third metal layers. The first metal layers are, for example, Ti layers with thicknesses of approximately 10 nm to 20 nm. The second metal layers are, for example, AlCu layers with thicknesses of approximately 100 nm to 300 nm. The third metal layers are, for example, Ti layers with thicknesses of approximately 10 nm to 20 nm. The fourth metal layers are, for example, TiN layers with thicknesses of approximately 10 nm to 50 nm.

In the nitride semiconductor device 1, a heterojunction is formed by there being formed on the first nitride semiconductor layer 4 (electron transit layer), the second nitride semiconductor layer 5 (electron supply layer) that differs in bandgap (Al composition). The two-dimensional electron gas 11 is thereby formed inside the first nitride semiconductor layer 4 near the interface between the first nitride semiconductor layer 4 and the second nitride semiconductor layer 5, and an HEMT making use of the two-dimensional electron gas 11 as a channel is formed. The gate electrode 22 faces the second nitride semiconductor layer 5 across the third nitride semiconductor layer 21.

Below the gate electrode 22, energy levels of the first nitride semiconductor layer 4 and the second nitride semiconductor layer 5 are pulled up by the ionized acceptors contained in the third nitride semiconductor layer 21 that is constituted of the p type GaN layer. The energy level of the conduction band at the heterojunction interface between the first nitride semiconductor layer 4 and the second nitride semiconductor layer 5 is thus made higher than the Fermi level. Therefore, the two-dimensional electron gas 11 formed by the spontaneous polarizations of the first nitride semiconductor layer 4 and the second nitride semiconductor layer 5 and the piezo polarization due to the lattice mismatch of the two layers is not formed directly below the gate electrode 22 (gate portion 20).

Therefore, when a bias is not applied to the gate electrode 22 (zero bias state), the channel due to the two-dimensional electron gas 11 is interrupted directly below the gate electrode 22. A normally-off type HEMT is thus realized. When an appropriate on voltage (for example, of 5 V) is applied to the gate electrode 22, a channel is induced inside the first nitride semiconductor layer 4 directly below the gate electrode 22 and the two-dimensional electron gas 11 at both sides of the gate electrode 22 becomes connected. The source and the drain are thereby made continuous to each other.

For use, for example, a predetermined voltage (for example, of 50 V to 100 V) with which the drain electrode 10 side becomes positive is applied between the source electrode 9 and the drain electrode 10. In this state, an off voltage (0 V) or the on voltage (5 V) is applied to the gate electrode 22 with the source electrode 9 being at a reference potential (0 V).

If an on resistance is $R_{ON}$ and a gate charge is $Q_G$, $R_{ON} \cdot Q_G$ is preferably not more than 150 [mΩnc] and is more preferably not more than 90 [mΩnc]. In this state, a drain-source withstand voltage is, for example, 100 V to 150 V.

FIG. 3A to FIG. 3I are sectional views for describing an example of a manufacturing process of the nitride semiconductor device 1 described above and show a cross-sectional structure at a plurality of stages in the manufacturing process.

Figure 3A:
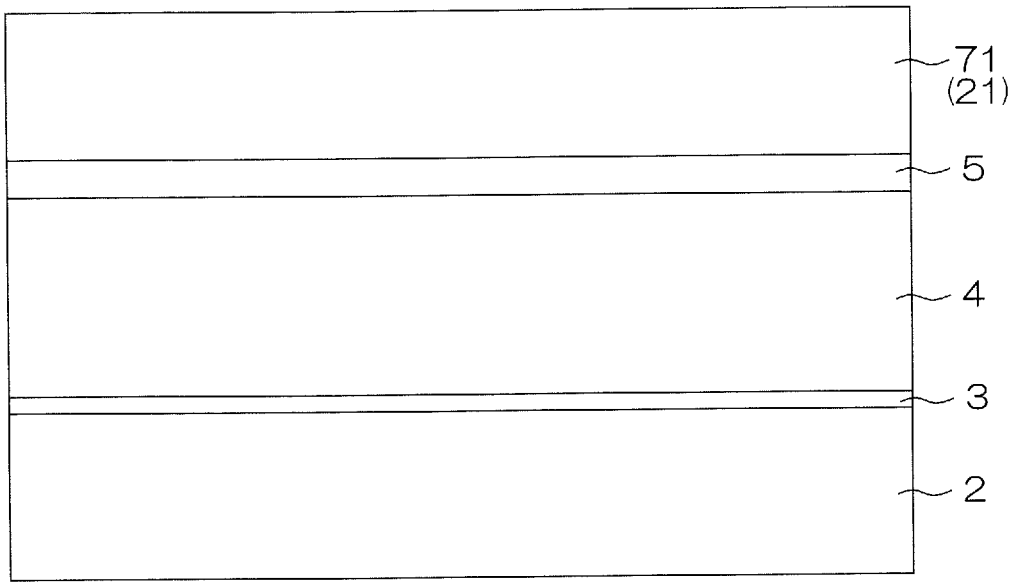
FIG. 3A is a sectional view of an example of a manufacturing process of the nitride semiconductor device of FIG. 1.

First, as shown in FIG. 3A, the buffer layer 3, the first nitride semiconductor layer (electron transit layer) 4, and the second nitride semiconductor layer (electron supply layer) 5 are epitaxially grown on the substrate 2 by an MOCVD (metal organic chemical vapor deposition) method. Further, a third semiconductor material film 71 that is a material film of the third nitride semiconductor layer 21 is epitaxially grown on the second nitride semiconductor layer 5 by the MOCVD method.

Figure 3B:
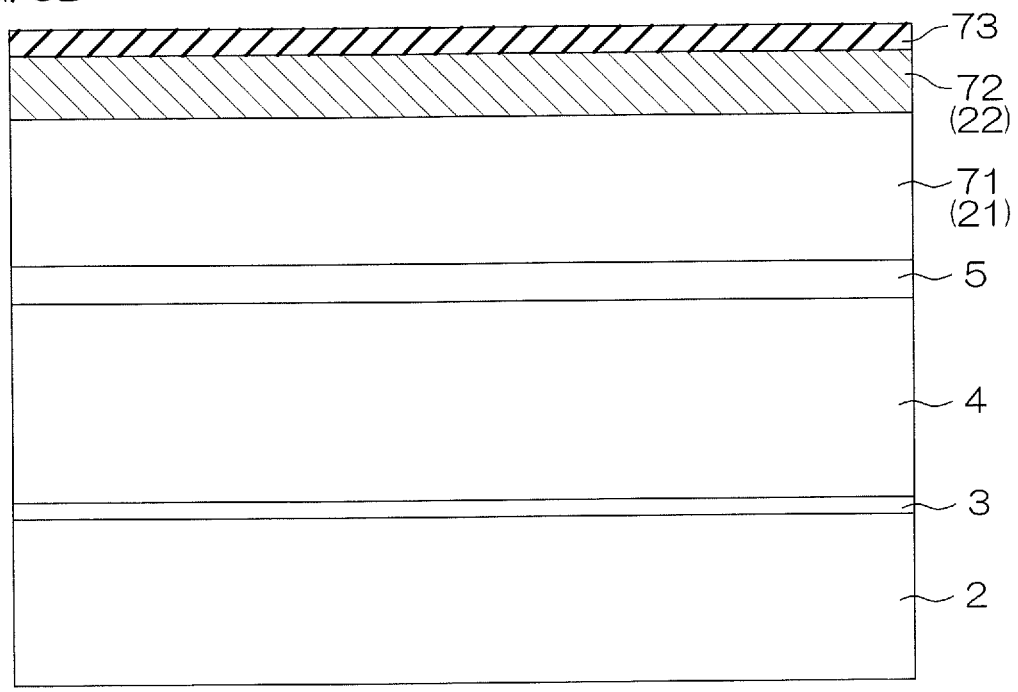
FIG. 3B is a sectional view of a step subsequent to that of FIG. 3A.

Next, as shown in FIG. 3B, a gate electrode film 72 that is a material film of the gate electrode 22 is formed, for example, by a sputtering method such as to cover an entire front surface that is exposed. A first $SiO_2$ film 73 is then formed on the gate electrode film 72.

Figure 3C:
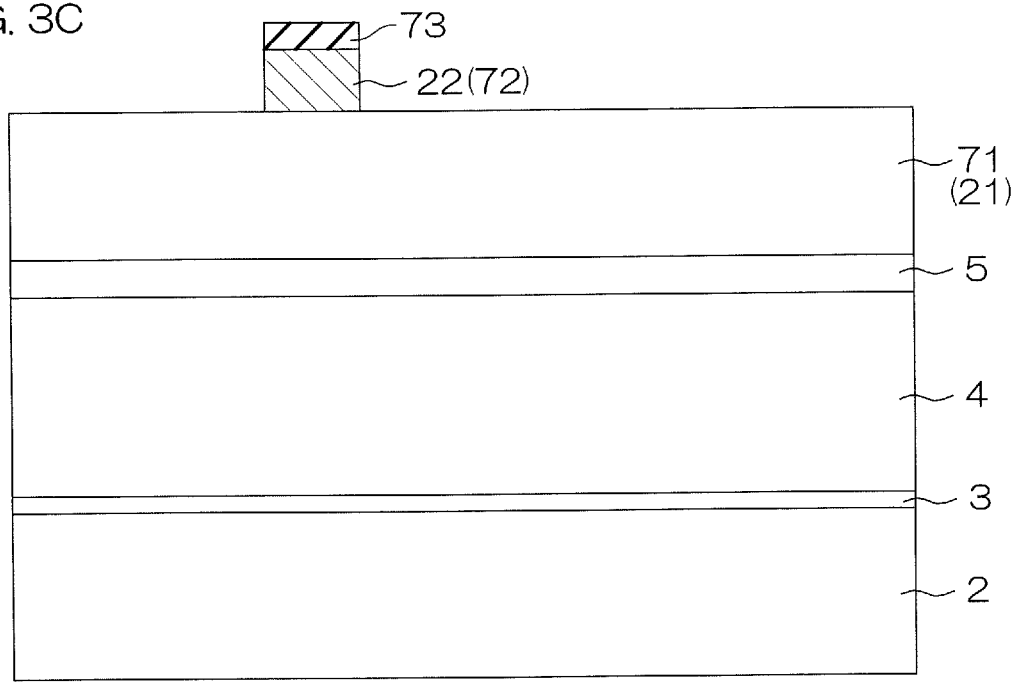
FIG. 3C is a sectional view of a step subsequent to that of FIG. 3B.

Next, as shown in FIG. 3C, for example, by dry etching, the first $SiO_2$ film 73 is selectively removed while leaving the first $SiO_2$ film 73 on a gate electrode preparation planned region of the gate electrode film 72 front surface. The gate electrode film 72 is then patterned by performing dry etching using the first $SiO_2$ film 73 as a mask. The gate electrode 22 is thereby formed.

Figure 3D:
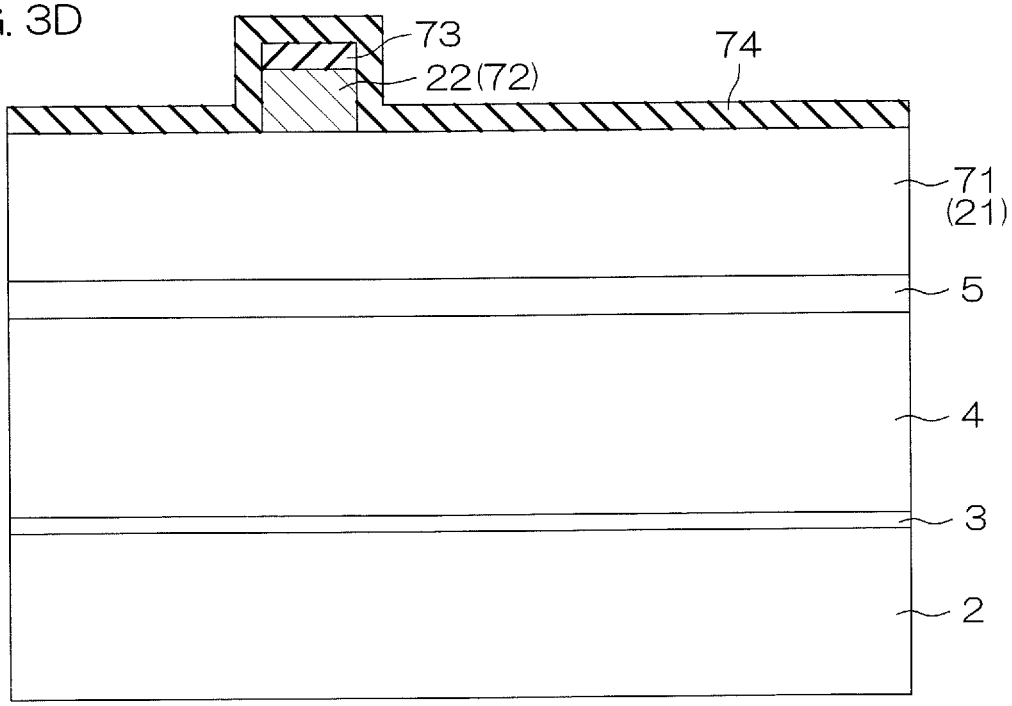
FIG. 3D is a sectional view of a step subsequent to that of FIG. 3C.

Next, as shown in FIG. 3D, a second $SiO_2$ film 74 is formed, for example, by a plasma enhanced chemical vapor deposition method (PECVD method) such as to cover entire surfaces that are exposed.

Figure 3E:
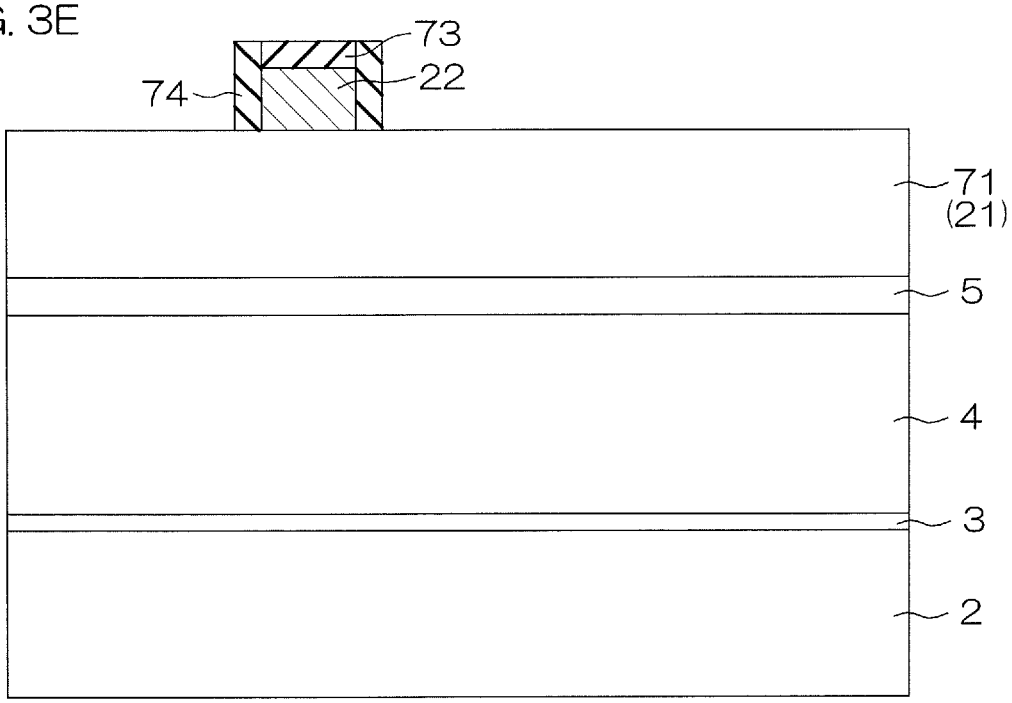
FIG. 3E is a sectional view of a step subsequent to that of FIG. 3D.

Next, as shown in FIG. 3E, for example, by dry etching, the second $SiO_2$ film 74 is etched back such as to form the second $SiO_2$ film 74 that covers side surfaces of the gate electrode 22 and the first $SiO_2$ film 73.

Figure 3F:
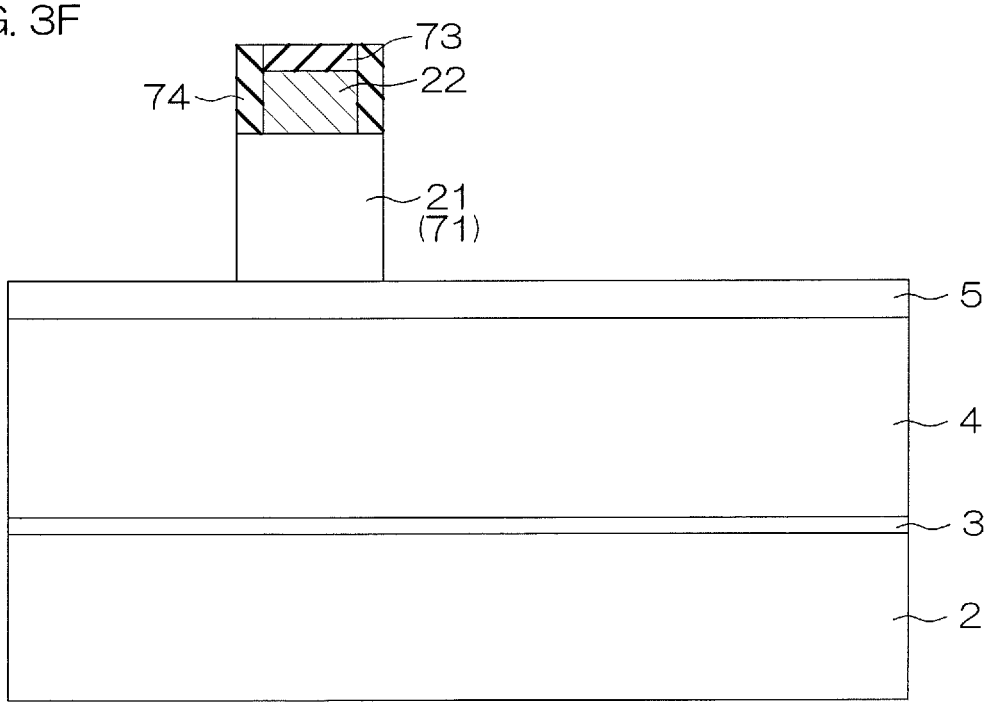
FIG. 3F is a sectional view of a step subsequent to that of FIG. 3E.

Next, as shown in FIG. 3F, the third semiconductor material film 71 is patterned by dry etching using the first $SiO_2$ film 73 and the second $SiO_2$ film 74 as masks. The third nitride semiconductor layer 21 of the ridge shape is thereby obtained.

Figure 3G:
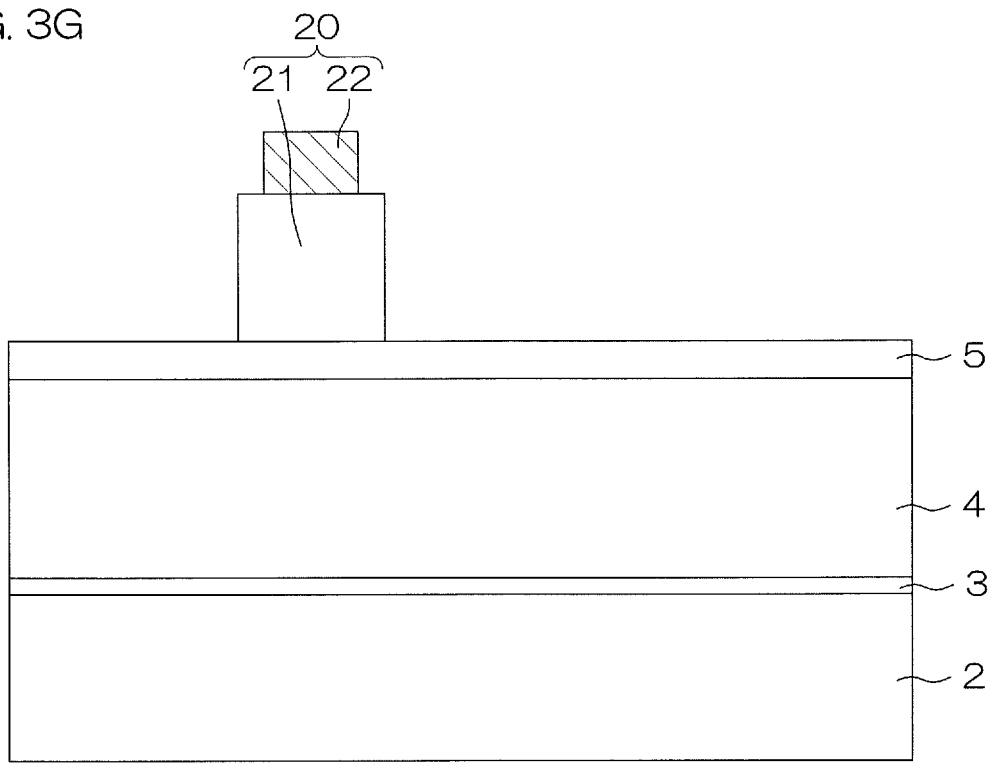
FIG. 3G is a sectional view of a step subsequent to that of FIG. 3F.

Next, as shown in FIG. 3G, the first $SiO_2$ film 73 and the second $SiO_2$ film 74 are removed by wet etching. The gate portion 20 that is constituted of the third nitride semiconductor layer 21 of the ridge shape and the gate electrode 22 formed on the width intermediate portion of the upper surface of the third nitride semiconductor layer 21 is thereby formed.

Figure 3H:
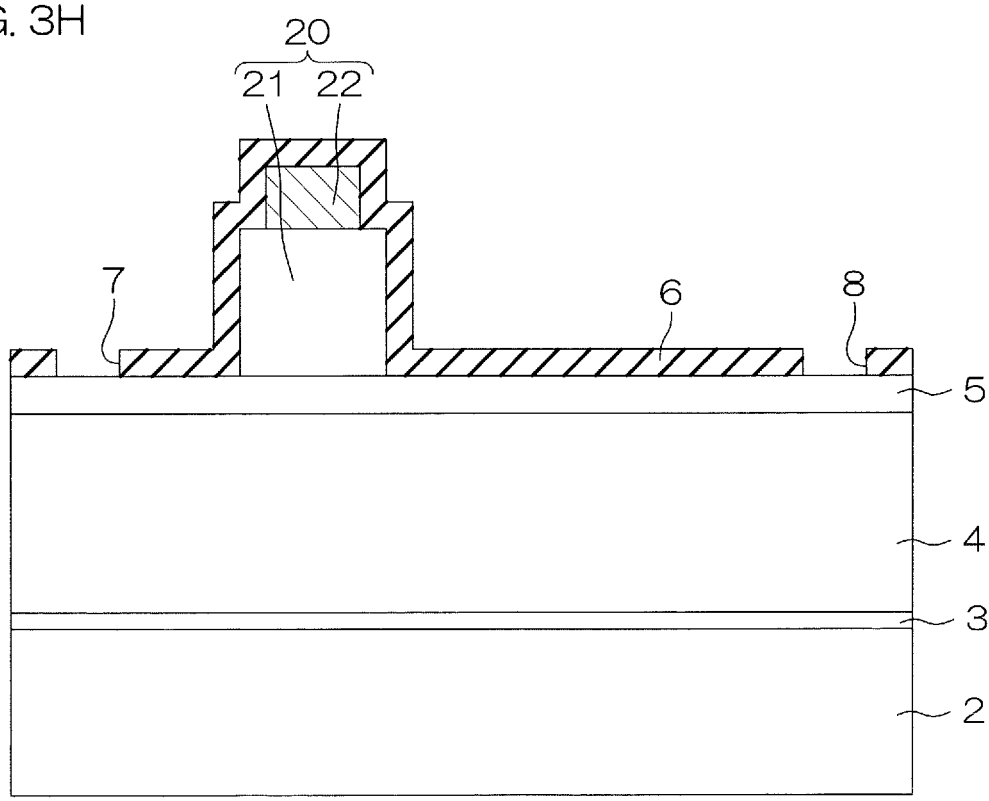
FIG. 3H is a sectional view of a step subsequent to that of FIG. 3G.
Figure 3:
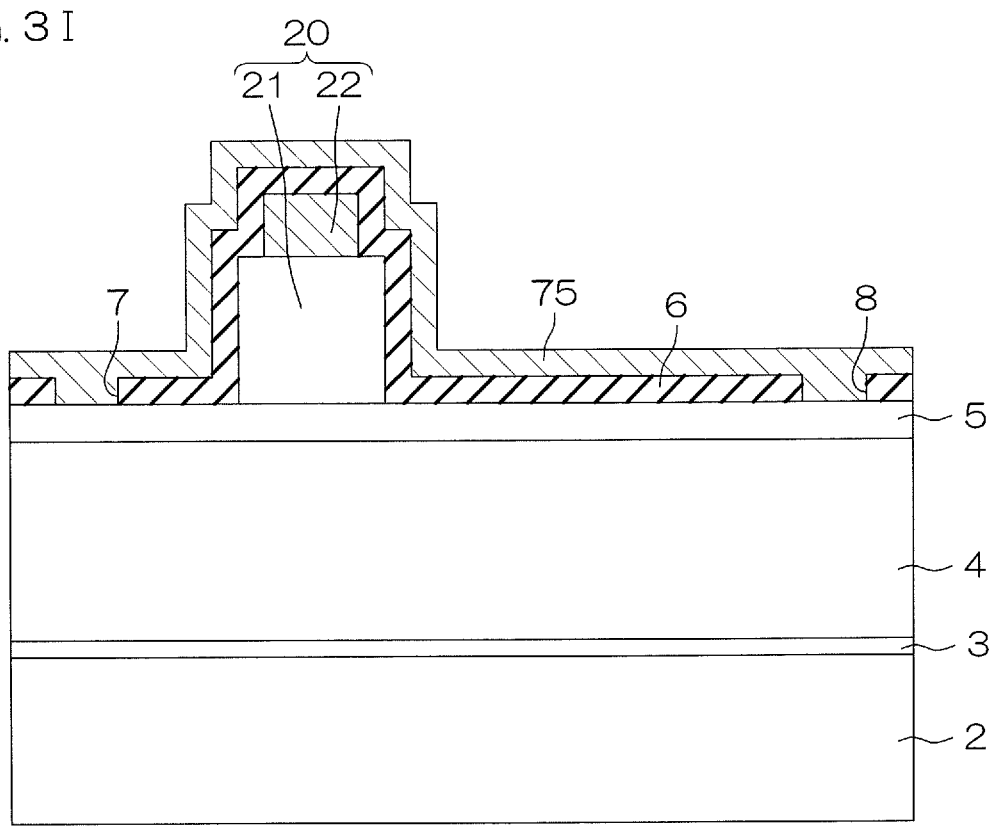
FIG. 3I is a sectional view of a step subsequent to that of FIG. 3H.

Next, as shown in FIG. 3H, the passivation film 6 is formed such as to cover entire surfaces that are exposed. The passivation film 6 is constituted, for example, of SiN. The source contact hole 7 and the drain contact hole 8 that reach to the second nitride semiconductor layer 5 are then formed in the passivation film 6.

Next, as shown in FIG. 3I, a source/drain electrode film 75 is formed such as to cover entire surfaces that are exposed.

Lastly, the source/drain electrode film 75 is patterned by photolithography and etching to form the source electrode 9 and the drain electrode 10 that are in ohmic contact with the second nitride semiconductor layer 5. The nitride semiconductor device 1 with the structure such as shown in FIG. 1 is thereby obtained.

[Simulation]

For each of a case where the thickness of the third nitride semiconductor layer 21 in the nitride semiconductor device 1 is 60 nm and a case where the thickness is 120 nm, an electric field intensity distribution in the third nitride semiconductor layer 21 interior when the gate-source voltage (gate voltage) $V_{GS}$ is 12 V was examined by simulation. As a result, it was found that when the thickness of the third nitride semiconductor layer 21 is 120 nm, the electric field intensity in the third nitride semiconductor layer 21 interior became low in comparison to the case where the thickness of the third nitride semiconductor layer 21 is 60 nm.

From this simulation result, it can be considered that the electric field intensity in the third nitride semiconductor layer 21 interior decreases as the thickness of the third nitride semiconductor layer 21 becomes thicker. It can thus be considered that the gate leak current decreases as the thickness of the third nitride semiconductor layer 21 becomes thicker.

[Experiment 1]

Seven samples S1 to S7 that differ in at least one of either of the film thickness of the third nitride semiconductor layer 21 in the nitride semiconductor device and the average concentration of the acceptor type impurity of the thickness direction upper half portion of the third nitride semiconductor layer 21 were prepared. The acceptor type impurity is Mg. The film thickness and the average concentration of the acceptor type impurity (Mg concentration) of the thickness direction upper half portion of the third nitride semiconductor layer 21 of each of the samples S1 to S7 are as follows.

S1: Film thickness=70 nm; Mg concentration=$1 \times 10^{19}$ $cm^{-3}$

S2: Film thickness=90 nm; Mg concentration=$1 \times 10^{19}$ $cm^{-3}$

S3: Film thickness=120 nm; Mg concentration=$1 \times 10^{19}$ $cm^{-3}$

S4: Film thickness=150 nm; Mg concentration=$1 \times 10^{19}$ $cm^{-3}$

S5: Film thickness=90 nm; Mg concentration=$6 \times 10^{18}$ $cm^{-3}$

S6: Film thickness=120 nm; Mg concentration=$6 \times 10^{18}$ $cm^{-3}$

S7: Film thickness=150 nm; Mg concentration=$6 \times 10^{18}$ $cm^{-3}$

And, for each of these samples S1 to S7, a gate leak current $I_G$ versus the gate-source voltage $V_{GS}$ was measured by experiment.

Figure 4:
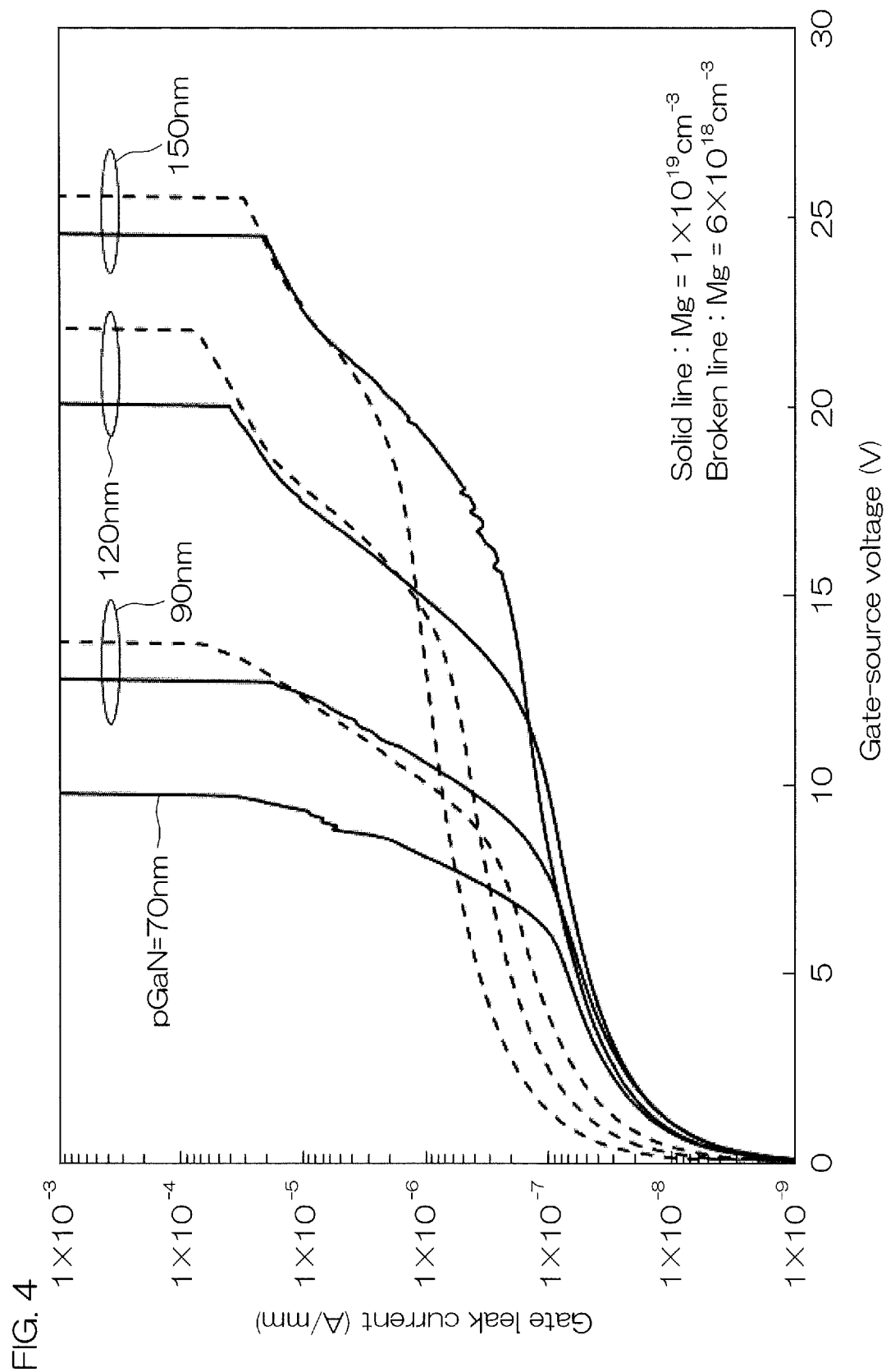
FIG. 4 is a graph of measurement results of a gate leak current $I_G$ versus a gate-source voltage $V_{GS}$ of each of seven samples that differ in at least one of either of a film thickness of the third nitride semiconductor layer and an average concentration of the acceptor type impurity of a thickness direction upper half portion of the third nitride semiconductor layer.

FIG. 4 is a graph of the measurement results of the gate leak current $I_G$ versus the gate-source voltage $V_{GS}$.

From these measurement results, it can be understood that a gate-source voltage at which the gate leak current increases suddenly (gate-source voltage at which a gate breakdown occurs) increases as the thickness of the third nitride semiconductor layer 21 increases. It can thus also be understood that a positive direction maximum rated gate voltage increases as the thickness of the third nitride semiconductor layer 21 increases. From this standpoint, the thickness of the third nitride semiconductor layer 21 is preferably greater than 100 nm and more preferably not less than 110 nm.

From FIG. 4, it is assumed that if the thickness of the third nitride semiconductor layer 21 is greater than 100 nm, a gate-source voltage of 8 V would be within a guaranteed voltage range (within a positive direction maximum rated gate voltage range). It is assumed that if the thickness of the third nitride semiconductor layer 21 is not less than 110 nm, a gate-source voltage of 9 V would be within the guaranteed voltage range (within the positive direction maximum rated gate voltage range).

On the other hand, when the Mg concentration is $6 \times 10^{18}$ $cm^{-3}$, in a region in which the gate-source voltage is lower than the gate-source voltage at which the gate breakdown occurs, the gate leak current increases as the thickness of the third nitride semiconductor layer 21 becomes thicker. The thickness of the third nitride semiconductor layer 21 is thus preferably greater than 100 nm but not more than 150 nm and is more preferably not less than 110 nm and not more than 150 nm.

From FIG. 4, it is assumed that the gate-source voltage at which the gate breakdown occurs increases even when the thickness of the third nitride semiconductor layer 21 is greater than 150 nm and it is thus needless to say that the thickness of the third nitride semiconductor layer 21 may be greater than 150 nm.

Also, it can be understood that the gate-source voltage at which the gate breakdown occurs is higher when the Mg concentration is $6\times10^{18}$ cm$^{-3}$ than when the Mg concentration is $1\times10^{19}$ cm$^{-3}$. That is, it can be considered that the gate-source voltage at which the gate breakdown occurs increases as the Mg concentration decreases. However, on the other hand, in the region in which the gate-source voltage is lower than the gate-source voltage at which the gate breakdown occurs, the gate leak current increases as the Mg concentration decreases, and it is therefore considered that it is preferable for the Mg concentration to be within a certain range. From this standpoint, the average concentration of the acceptor type impurity (Mg concentration) of the thickness direction upper half portion of the third nitride semiconductor layer 21 is preferably not less than $4\times10^{19}$ cm$^{-3}$ and not more than $1\times10^{19}$ cm$^{-3}$.

[Experiment 2]

A threshold voltage was examined for each of cases where a targeted concentration value (target concentration) of Mg that is the acceptor type impurity added to the third nitride semiconductor layer 21 is $1\times10^{19}$ cm$^{-3}$, $3\times10^{19}$ cm$^{-3}$, and $6\times10^{19}$ cm$^{-3}$.

FIG. 5 is a graph of the results.

As shown in FIG. 5, in comparing the case where the target concentration of Mg is $1\times10^{19}$ cm$^{-3}$ and the case where the target concentration of Mg is $3\times10^{19}$ cm$^{-3}$, the threshold voltage is greater for the higher target concentration of Mg. On the other hand, in comparing the case where the target concentration of Mg is $3\times10^{19}$ cm$^{-3}$ and the case where the target concentration of Mg is $6\times10^{19}$ cm$^{-3}$, the threshold voltage is greater for the lower target concentration of Mg.

FIG. 5 thus indicates that the threshold voltage may decrease when concentration of Mg that is the impurity becomes greater than $3\times10^{19}$ cm$^{-3}$. A cause of this is considered to be that crystal defects that act on the n type increase when too much Mg that is the impurity is added to the third nitride semiconductor layer 21. This also supports the requirement that an upper limit should be placed on the Mg concentration.

With the preferred embodiment described above, due to the second nitride semiconductor layer 5 being AlGaN, the Al composition thereof being not more than 15%, and the film thickness being not less than 15 nm, it is possible to increase the threshold voltage. The threshold voltage is preferably not less than 1 V and more preferably not less than 1.3 V.

In the present preferred embodiment, a Schottky metal is used in the gate electrode 22, the gate electrode and the third nitride semiconductor layer 21 are in Schottky contact, and thus, it is arranged from the beginning such that a gate current does not flow. The arrangement thus differs in concept from that of Patent Literature 2 with which a main operation is to make a gate current flow.

FIG. 6A to FIG. 6D are respectively graphs of yet other setting examples of the concentration of the acceptor type impurity versus the thickness direction position of the third nitride semiconductor layer 21.

Figure 6A:
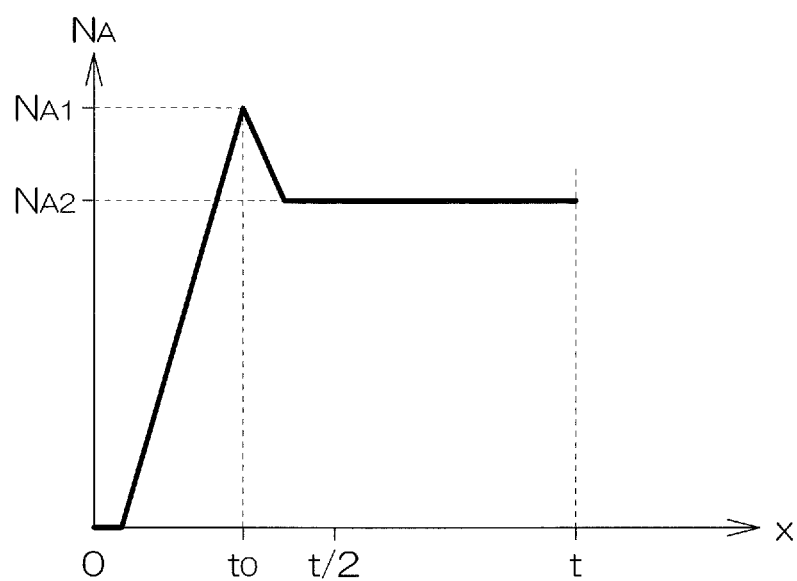
FIG. 6A is a graph of yet another setting example of the concentration of the acceptor type impurity versus the thickness direction position of the third nitride semiconductor layer.

In FIG. 6A, $N_{A1}$, $N_{A2}$, $t$, and $t_0$ are as follows.

$$N_{A1} = 4 \times 10^{19} \text{ cm}^{-3}$$
$$N_{A2} = 3 \times 10^{19} \text{ cm}^{-3}$$
$$t = 120 \text{ nm}$$
$$t_0 = 30 \text{ nm}$$

With the example of FIG. 6A, the acceptor type impurity concentration is set to zero in a vicinity where the thickness direction position x of the third nitride semiconductor layer 21 is 0. In a region in which the thickness direction position x of the third nitride semiconductor layer 21 is greater than being close to 0 but not more than $t_0$ ($t_0<t/2$), the acceptor type impurity concentration increases rapidly from 0 to $N_{A1}$ as the thickness direction position x of the third nitride semiconductor layer 21 increases.

In a region in which the thickness direction position x of the third nitride semiconductor layer 21 is greater than $t_0$ but is not more than a predetermined position that is intermediate of $t_0$ and $t$, the acceptor type impurity concentration decreases rapidly to $N_{A2}$ as the thickness direction position x of the third nitride semiconductor layer 21 increases. In a region in which the thickness direction position x of the third nitride semiconductor layer 21 is not less than a position at which the acceptor type impurity concentration decreased to $N_{A2}$ but is less than $t$, the acceptor type impurity concentration is maintained at $N_{A2}$. With the example of FIG. 6A, a peak value of the acceptor type impurity is $4\times10^{19}$ cm$^{-3}$.

Figure 6B:
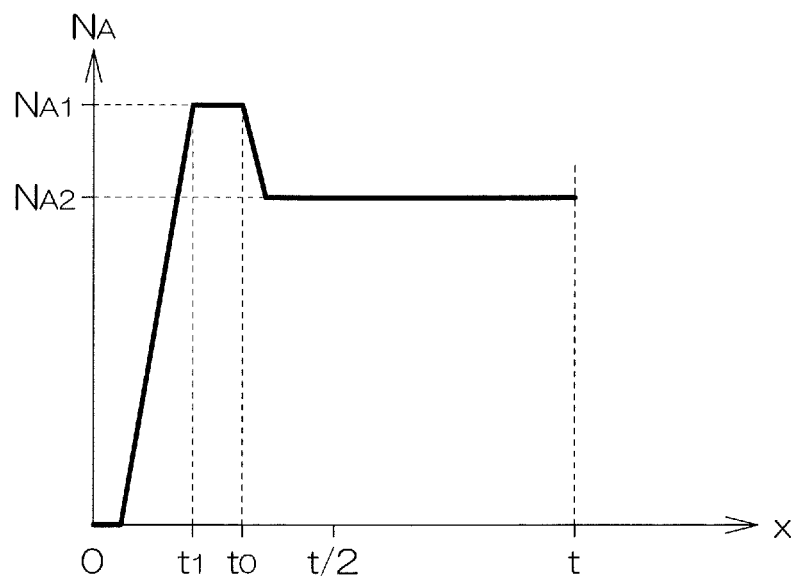
FIG. 6B is a graph of yet another setting example of the concentration of the acceptor type impurity versus the thickness direction position of the third nitride semiconductor layer.

In FIG. 6B, $N_{A1}$, $N_{A2}$, $t$, $t_0$, and $t_1$ are as follows.

$$N_{A1} = 4 \times 10^{19} \text{ cm}^{-3}$$
$$N_{A2} = 3 \times 10^{19} \text{ cm}^{-3}$$
$$t = 120 \text{ nm}$$
$$t_0 = 40 \text{ nm}$$
$$t_1 = 20 \text{ nm}$$

With the example of FIG. 6B, the acceptor type impurity concentration is set to zero in the vicinity where the thickness direction position x of the third nitride semiconductor layer 21 is 0. In a region in which the thickness direction position x of the third nitride semiconductor layer 21 is greater than being close to 0 but not more than $t_1$ ($t_1<t_0$), the acceptor type impurity concentration increases rapidly from 0 to $N_{A1}$ as the thickness direction position x of the third nitride semiconductor layer 21 increases. In a region in which the thickness direction position x of the third nitride semiconductor layer 21 is greater than $t_1$ but is not more than $t_0$ ($t_0<t/2$), the acceptor type impurity concentration is maintained at $N_{A1}$.

In a region in which the thickness direction position x of the third nitride semiconductor layer 21 is greater than $t_0$ but is not more than a predetermined position that is intermediate of $t_0$ and $t/2$, the acceptor type impurity concentration decreases rapidly to $N_{A2}$ as the thickness direction position x of the third nitride semiconductor layer 21 increases. In a region in which the thickness direction position x of the third nitride semiconductor layer 21 is not less than a position at which the acceptor type impurity concentration decreased to $N_{A2}$ but is less than t, the acceptor type impurity concentration is maintained at $N_{A2}$. With the example of FIG. 6B, the peak value of the acceptor type impurity is $4 \times 10^{19}$ cm$^{-3}$.

Figure 6C:
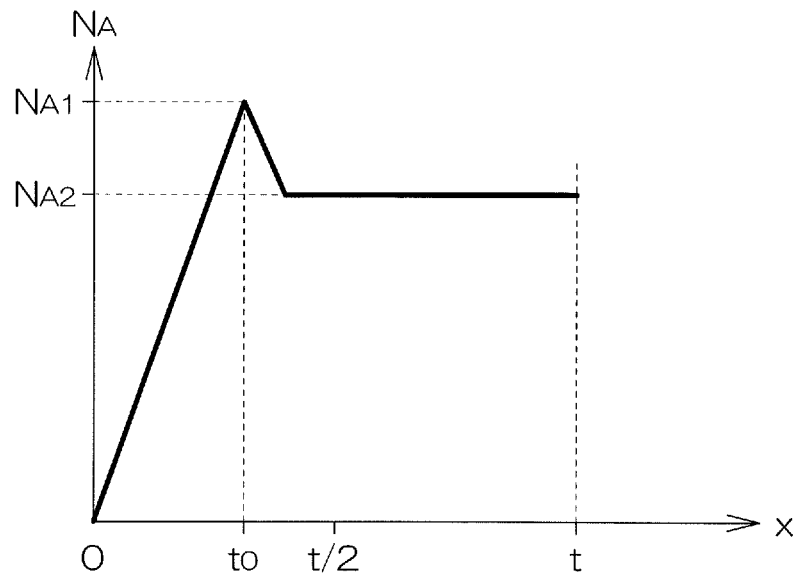
FIG. 6C is a graph of yet another setting example of the concentration of the acceptor type impurity versus the thickness direction position of the third nitride semiconductor layer.

In FIG. 6C, $N_{A1}$, $N_{A2}$, t, and $t_0$ are as follows.

$$N_{A1} = 4 \times 10^{19} \text{ cm}^{-3}$$
$$N_{A2} = 3 \times 10^{19} \text{ cm}^{-3}$$
$$t = 120 \text{ nm}$$
$$t_0 = 30 \text{ nm}$$

With the example of FIG. 6C, in a region in which the thickness direction position x of the third nitride semiconductor layer 21 is not less than 0 and not more than $t_0$, the acceptor type impurity concentration increases rapidly from 0 to $N_{A1}$ as the thickness direction position x of the third nitride semiconductor layer 21 increases. In a region in which the thickness direction position x of the third nitride semiconductor layer 21 is greater than $t_0$ but is not more than a predetermined position that is intermediate of $t_0$ and t/2, the acceptor type impurity concentration decreases rapidly to $N_{A2}$ as the thickness direction position x of the third nitride semiconductor layer 21 increases. In a region in which the thickness direction position x of the third nitride semiconductor layer 21 is not less than a position at which the acceptor type impurity concentration decreased to $N_{A2}$ but is less than t, the acceptor type impurity concentration is maintained at $N_{A2}$. With the example of FIG. 6C, a peak value of the acceptor type impurity is $4 \times 10^{19}$ cm$^{-3}$.

Figure 6D:
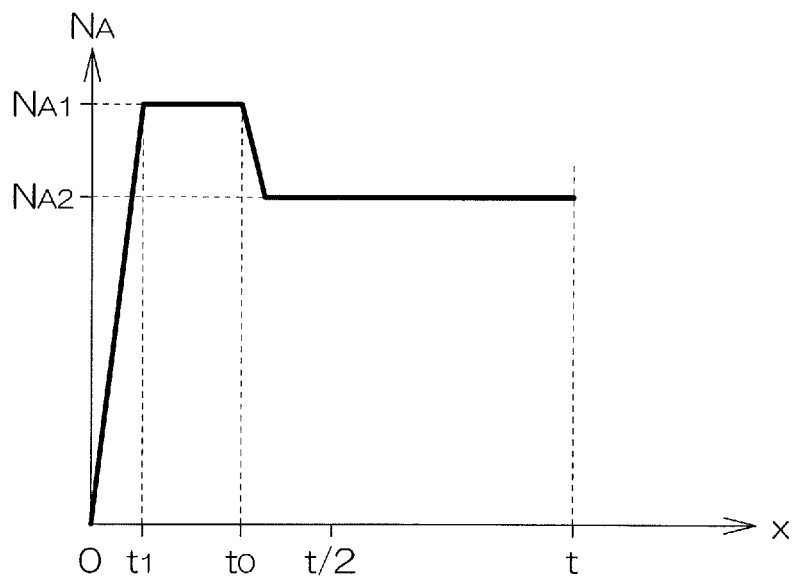
FIG. 6D is a graph of yet another setting example of the concentration of the acceptor type impurity versus the thickness direction position of the third nitride semiconductor layer.

In FIG. 6D, $N_{A1}$, $N_{A2}$, t, $t_0$, and $t_1$ are as follows.

$$N_{A1} = 4 \times 10^{19} \text{ cm}^{-3}$$
$$N_{A2} = 3 \times 10^{19} \text{ cm}^{-3}$$
$$t = 120 \text{ nm}$$
$$t_0 = 30 \text{ nm}$$
$$t_1 = 10 \text{ nm}$$

With the example of FIG. 6D, in a region in which the thickness direction position x of the third nitride semiconductor layer 21 is not less than 0 and not more than $t_1$ ($t_1 < t_0$), the acceptor type impurity concentration increases rapidly from 0 to $N_{A1}$ as the thickness direction position x of the third nitride semiconductor layer 21 increases. In a region in which the thickness direction position x of the third nitride semiconductor layer 21 is greater than $t_1$ but is not more than $t_0$ ($t_0 < t/2$), the acceptor type impurity concentration is maintained at $N_{A1}$.

In a region in which the thickness direction position x of the third nitride semiconductor layer 21 is greater than $t_0$ but is not more than a predetermined position that is intermediate of $t_0$ and t/2, the acceptor type impurity concentration decreases rapidly to $N_{A2}$ as the thickness direction position x of the third nitride semiconductor layer 21 increases. In a region in which the thickness direction position x of the third nitride semiconductor layer 21 is not less than a position at which the acceptor type impurity concentration decreased to $N_{A2}$ but is less than t, the acceptor type impurity concentration is maintained at $N_{A2}$. With the example of FIG. 6D, the peak value of the acceptor type impurity is $4 \times 10^{19}$ cm$^{-3}$.

As shown in FIG. 6A to FIG. 6D, it is preferable for the peak value of the acceptor type impurity in a thickness direction lower half portion of the third nitride semiconductor layer 21 to be not more than $4 \times 10^{19}$ cm$^{-3}$.

FIG. 7 to FIG. 10 are sectional views for describing the arrangements of nitride semiconductor devices 1A to 1D according to second to fifths preferred embodiments of the present invention. In FIG. 7 to FIG. 10, portions corresponding to respective portions of FIG. 1 described above are indicated with the same reference signs attached as in FIG. 1.

Figure 7:
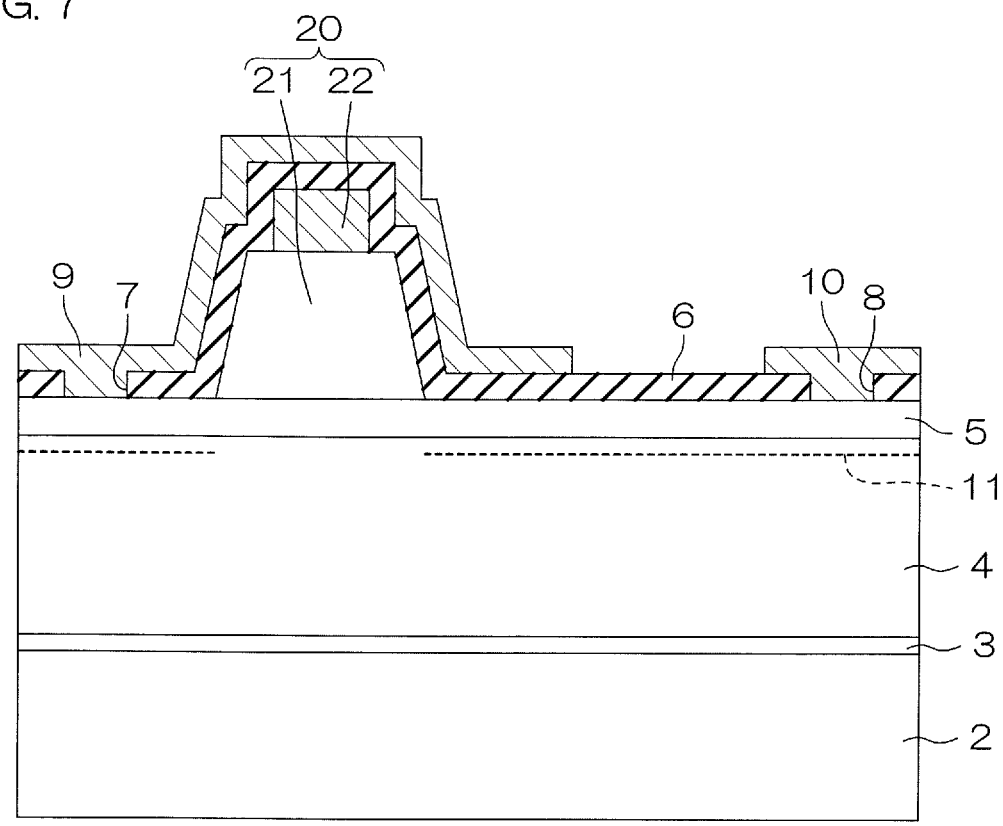
FIG. 7 is a sectional view for describing the arrangement of a nitride semiconductor device according to a second preferred embodiment of the present invention.

Referring to FIG. 7, with the nitride semiconductor device 1A according to the second preferred embodiment, the lateral cross section of the third nitride semiconductor layer 21 has an isosceles trapezoidal shape.

Figure 8:
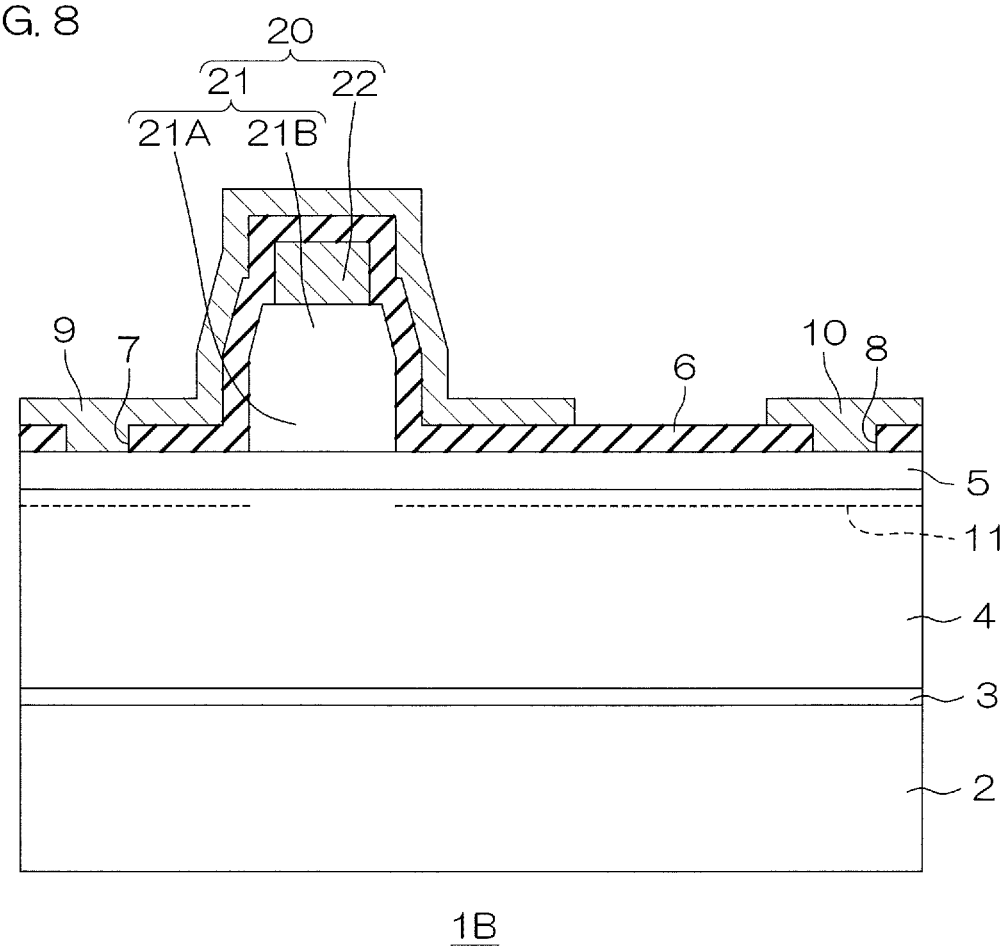
FIG. 8 is a sectional view for describing the arrangement of a nitride semiconductor device according to a third preferred embodiment of the present invention.

Referring to FIG. 8, with the nitride semiconductor device 1B according to the third preferred embodiment, the third nitride semiconductor layer 21 is constituted of a lower portion 21A that is formed on the second nitride semiconductor layer 5 and with which a lateral cross section has a laterally long rectangular shape and an upper portion 21B that is formed on an upper surface of the lower portion 21A and with which a lateral cross section has an isosceles trapezoidal shape.

Figure 9:
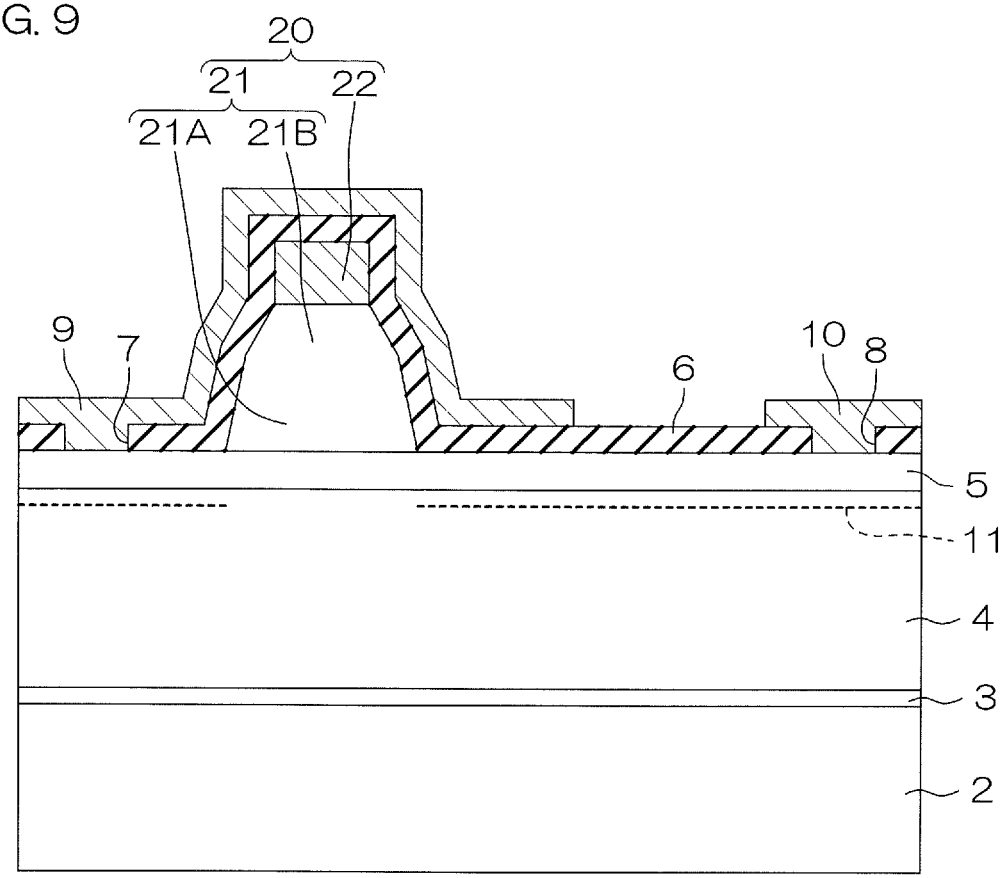
FIG. 9 is a sectional view for describing the arrangement of a nitride semiconductor device according to a fourth preferred embodiment of the present invention.

Referring to FIG. 9, with the nitride semiconductor device 10 according to the fourth preferred embodiment, the third nitride semiconductor layer 21 is constituted of a lower portion 21A that is formed on the second nitride semiconductor layer 5 and with which a lateral cross section has an isosceles trapezoidal shape and an upper portion 21B that is formed on an upper surface of the lower portion 21A and with which a lateral cross section has an isosceles trapezoidal shape. Gradients of side surfaces of the lower portion 21A with respect to the front surface of the second nitride semiconductor layer 5 is greater than gradients of side surfaces of the upper portion 21B with respect to the front surface of the second nitride semiconductor layer 5.

Figure 10:
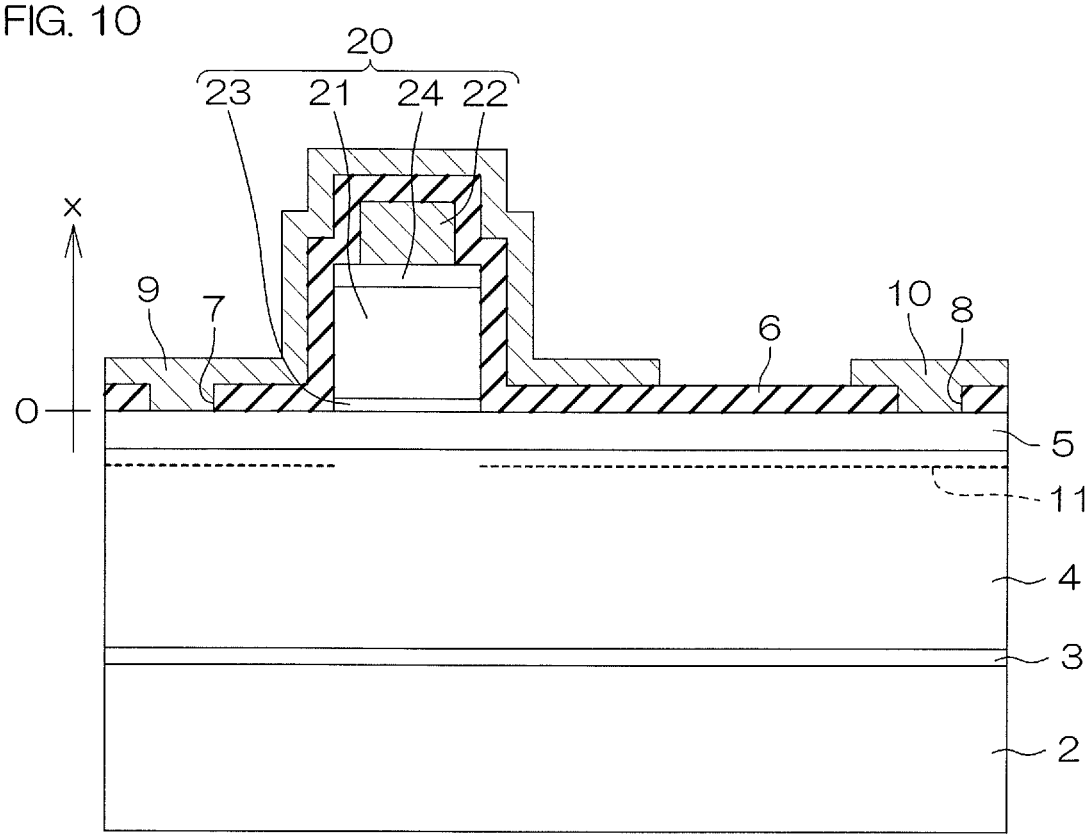
FIG. 10 is a sectional view for describing the arrangement of a nitride semiconductor device according to a fifth preferred embodiment of the present invention.

Referring to FIG. 10, with the nitride semiconductor device 1D according to the fifth preferred embodiment, a fifth nitride semiconductor layer 23 that is larger in bandgap than the second nitride semiconductor layer 5 is interposed between the second nitride semiconductor layer 5 and the third nitride semiconductor layer 21. Also, a fourth nitride semiconductor layer 24 that is larger in bandgap than the third nitride semiconductor layer 21 is formed on the entire third nitride semiconductor layer 21 upper surface. Also, the gate electrode 22 is formed on a width intermediate portion of an upper surface of the fourth nitride semiconductor layer 24. The fourth nitride semiconductor layer 24 is an example of a "fourth nitride semiconductor layer" of the present invention and the fifth nitride semiconductor layer 23 is an example of a "fifth nitride semiconductor layer" of the present invention.

The gate portion 20 is thus constituted of the fifth nitride semiconductor layer 23 that is formed on the second nitride semiconductor layer 5, the third nitride semiconductor layer 21 that is formed on the fifth nitride semiconductor layer 23, the fourth nitride semiconductor layer 24 that is formed on the third nitride semiconductor layer 21, and the gate electrode 22 that is formed on the fourth nitride semiconductor layer 24.

The fourth nitride semiconductor layer 24 is constituted of an $Al_zGa_{1-z}N$ ($0 \leq z < 1$, $y < x \leq z$) layer. A film thickness of the fourth nitride semiconductor layer 24 is approximately 10 nm to 15 nm. The fifth nitride semiconductor layer 23 is constituted of an $Al_aGa_{1-a}N$ ($0 \leq a < 1$, $z \leq a$) layer. A film thickness of the fifth nitride semiconductor layer 23 is approximately 1 nm to 5 nm. The film thickness of the fifth nitride semiconductor layer 23 is preferably thinner than the film thickness of the second nitride semiconductor layer 5.

With the fifth preferred embodiment, the fourth nitride semiconductor layer 24 that is larger in bandgap than the third nitride semiconductor layer 21 is interposed between the gate electrode 22 and the third nitride semiconductor layer 21 and therefore, the gate leak current can be reduced more in comparison to the first preferred embodiment. Also, the fifth nitride semiconductor layer 23 that is larger in bandgap and closer to being a resistor than the second nitride semiconductor layer 5 is interposed between the second nitride semiconductor layer 5 and the third nitride semiconductor layer 21 and therefore, the gate leak current can be reduced further.

Also, with the fifth preferred embodiment, the third nitride semiconductor layer 21 can be formed by patterning a material film of the third nitride semiconductor layer 21 by etching in a state where a material film of the fifth nitride semiconductor layer 23 is formed across an entire area of the front surface of the second nitride semiconductor layer 5 and the material film of the third nitride semiconductor layer 21 is formed on that material film. In this process, the material film of the fifth nitride semiconductor layer 23 can be used as an etching stop layer and therefore, etching of the front surface of the second nitride semiconductor layer 5 can be suppressed when patterning the material film of the third nitride semiconductor layer 21. A high effect can be anticipated for this, especially under circumstances where the film thickness of the third nitride semiconductor layer 21 is thick and etching control is more difficult.

Figure 11:
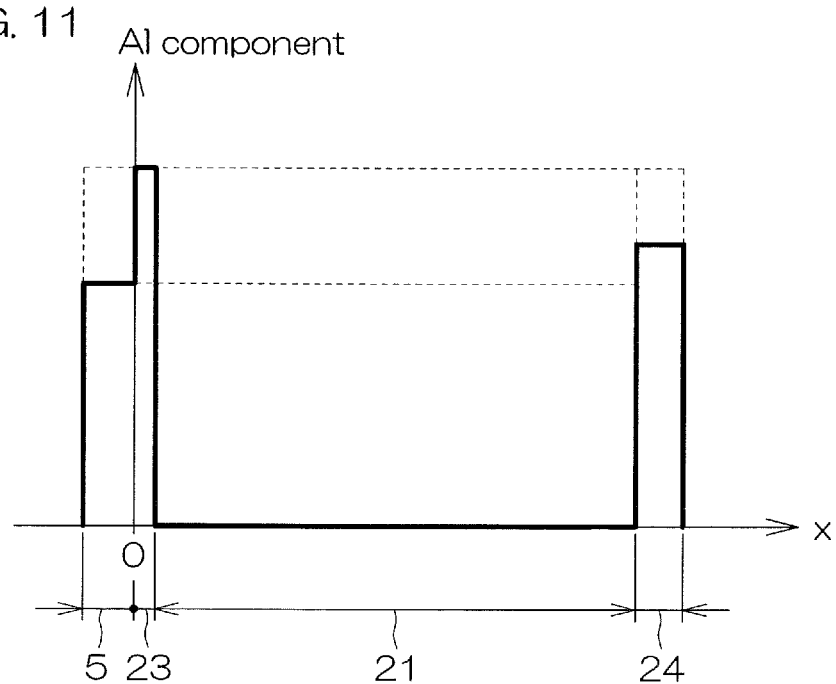
FIG. 11 is a graph of a setting example of an Al composition versus thickness direction positions of second, fifth, third, and fourth nitride semiconductor layers.

FIG. 11 is a graph of a setting example of an Al composition versus thickness direction positions of the second, fifth, third, and fourth nitride semiconductor layers 5, 23, 21, and 24. The thickness direction positions of the second, fifth, third, and fourth nitride semiconductor layers 5, 23, 21, and 24 are expressed by a distance x from a boundary position between the second nitride semiconductor layer 5 and the fifth nitride semiconductor layer 23 as shown in FIG. 10. However, x takes on a positive value at positions higher than the boundary between the second nitride semiconductor layer 5 and the fifth nitride semiconductor layer 23 and takes on a negative value at positions lower than the boundary position.

With the example of FIG. 11, an average value of Al compositions per unit thickness across a total film thickness of the second nitride semiconductor layer 5 and the fifth nitride semiconductor layer 23 is substantially equal to an Al composition per unit thickness of the fourth nitride semiconductor layer 24. A concentration of holes appearing at a surface of the third nitride semiconductor layer 21 at a fifth nitride semiconductor layer 23 side and a concentration of electrons appearing at a fourth nitride semiconductor layer 24 side surface of the third nitride semiconductor layer 21 are thereby made substantially equal and therefore, suppression of adverse effects to the threshold voltage can be anticipated even when the fifth nitride semiconductor layer 23 and the fourth nitride semiconductor layer 24 are formed.

Figure 12:
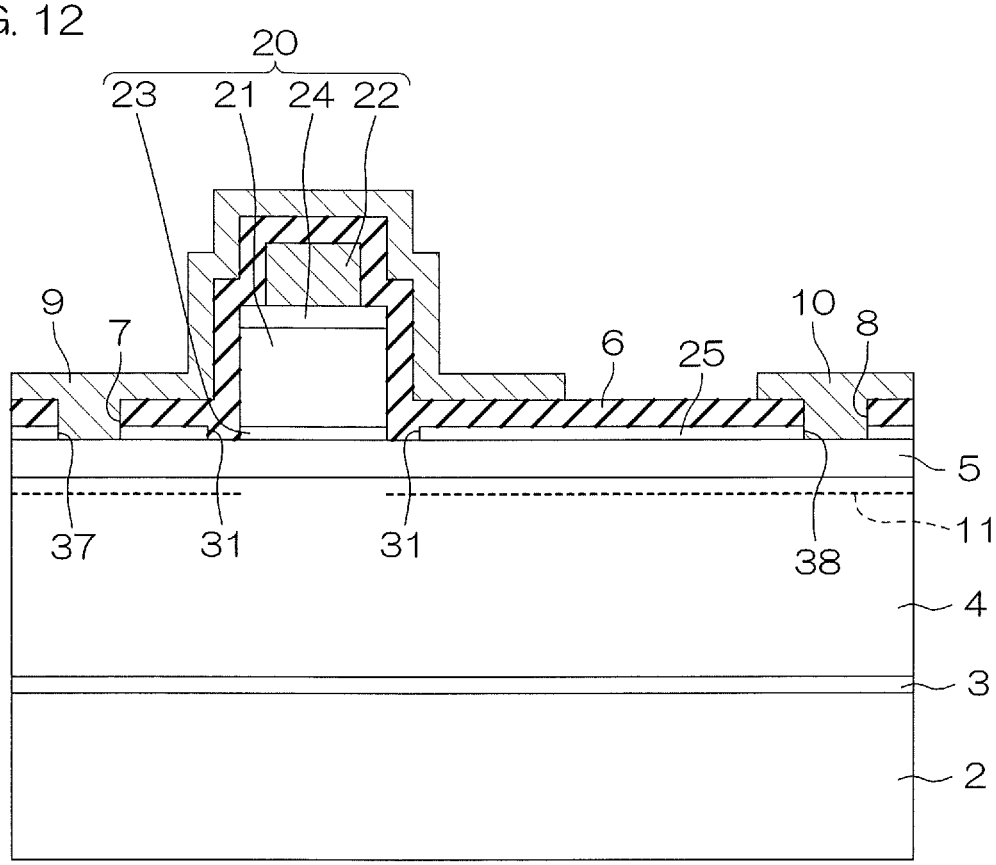
FIG. 12 is a sectional view for describing the arrangement of a nitride semiconductor device according to a sixth preferred embodiment of the present invention.

FIG. 12 is a sectional view for describing the arrangement of a nitride semiconductor device 1E according to a sixth preferred embodiment of the present invention. In FIG. 12, portions corresponding to respective portions of FIG. 10 described above are indicated with the same reference signs attached as in FIG. 10.

The nitride semiconductor device 1E according to the sixth preferred embodiment is substantially the same in arrangement as the nitride semiconductor device 1D according to the fifth preferred embodiment. The sixth preferred embodiment differs from the fifth preferred embodiment in the point that a sixth nitride semiconductor layer 25 that is constituted of the same material as the fifth nitride semiconductor layer 23 is formed in a region on the second nitride semiconductor layer 5 excluding the gate portion 20. With the sixth preferred embodiment, the fifth nitride semiconductor layer 23 and the sixth nitride semiconductor layer 25 correspond to being the "fifth nitride semiconductor layer" of the present invention. By this shape, a region in which formation of the two-dimensional electron gas 11 is suppressed is formed at the drain electrode 10 side from directly below the gate portion 20 and a drain-source leak current and a drain-source withstand voltage are improved.

However, in the sixth nitride semiconductor layer 25 that is formed in the region on the second nitride semiconductor layer 5 excluding the gate portion 20, a groove 31 that penetrates through the sixth nitride semiconductor layer 25 in the thickness direction is formed in a peripheral portion of the fifth nitride semiconductor layer 23 and a portion of the passivation film 6 enters into this groove. Also, the sixth nitride semiconductor layer 25 has formed therein a source contact hole 37 and a drain contact hole 38 that are respectively in communication with the source contact hole 7 and the drain contact hole 8 of the passivation film 6 laminated thereon.

The source electrode 9 penetrates through the source contact holes 7 and 37 and is in ohmic contact with the second nitride semiconductor layer 5. The drain electrode 10 penetrates through the drain contact holes 8 and 38 and is in ohmic contact with the second nitride semiconductor layer 5.

Figure 13:
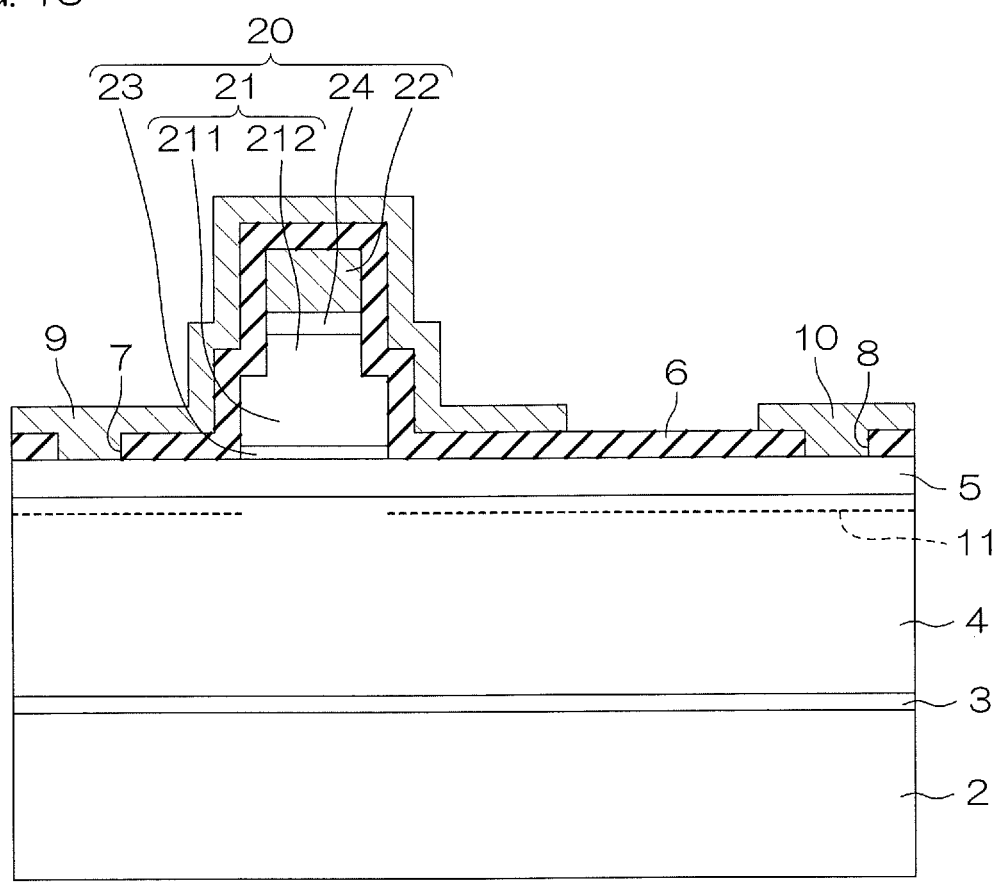
FIG. 13 is a sectional view for describing the arrangement of a nitride semiconductor device according to a seventh preferred embodiment of the present invention.

FIG. 13 is a sectional view for describing the arrangement of a nitride semiconductor device 1F according to a seventh preferred embodiment of the present invention. In FIG. 13, portions corresponding to respective portions of FIG. 10 described above are indicated with the same reference signs attached as in FIG. 10.

The nitride semiconductor device 1F according to the seventh preferred embodiment is substantially the same in arrangement as the nitride semiconductor device 1D according to the fifth preferred embodiment. With the seventh preferred embodiment, the third nitride semiconductor layer 21 is constituted of a main body portion 211 with a lateral cross section of laterally long rectangular shape that is formed on the fifth nitride semiconductor layer 23 and an upper protruding portion 212 that is formed on a width intermediate portion of a main body portion 211 upper surface.

A step is formed between an upper surface (top surface) of the upper protruding portion 212 and an upper surface at one side of the main body portion 211 and a step is formed between the upper surface of the upper protruding portion 212 and an upper surface at another side of the main body portion 211. The fourth nitride semiconductor layer 24 is formed across an entire area of the upper surface of the upper protruding portion 212. The gate electrode 22 is formed across an entire area of the upper surface of the fourth nitride semiconductor layer 24.

With the seventh preferred embodiment, an electric field concentrates at locations at which the upper surfaces of the main body portion 211 of the semiconductor gate layer 21 and the side surfaces of the upper protruding portion 212 intersect. That is, with the seventh preferred embodiment, positions at which the electric field concentrates can be separated from width direction ends of a lower surface of the gate electrode 22. It is thereby made possible to suppress a gate leak current from the width direction ends of the gate electrode 22. The gate leak current can thereby be reduced further.

Figure 14:
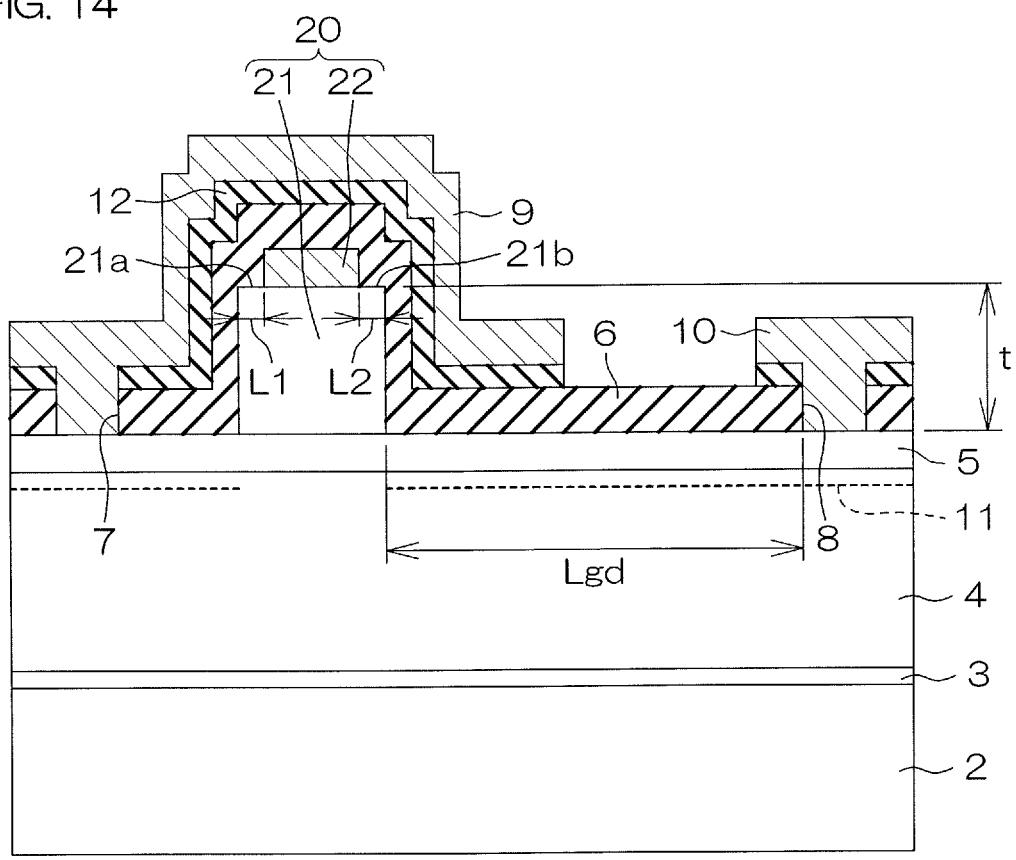
FIG. 14 is a sectional view for describing the arrangement of a nitride semiconductor device according to an eighth preferred embodiment of the present invention.

FIG. 14 is a sectional view for describing the arrangement of a nitride semiconductor device according to an eighth preferred embodiment of the present invention.

The nitride semiconductor device 1G includes the substrate 2, the buffer layer 3 that is formed on the front surface of the substrate 2, the first nitride semiconductor layer 4 that is epitaxially grown on the buffer layer 3, the second nitride semiconductor layer 5 that is epitaxially grown on the first nitride semiconductor layer 4, and the gate portion 20 that is formed on the second nitride semiconductor layer 5.

Further, the nitride semiconductor device 1G includes the passivation film 6 that covers the second nitride semiconductor layer 5 and the gate portion 20 and a barrier metal film 12 that is formed on the passivation film 6. Further, the nitride semiconductor device 1G includes the source electrode 9 and the drain electrode 10 that penetrate through the source contact hole 7 and the drain contact hole 8 formed in a laminated film of the passivation film 6 and the barrier metal film 12 and are in ohmic contact with the second nitride semiconductor layer 5. The source electrode 9 and the drain electrode 10 are disposed at an interval. The source electrode 9 is formed such as to cover the gate portion 20.

The substrate 2 may, for example, be a silicon substrate of low resistance. The silicon substrate of low resistance may be a p type substrate having an electric resistivity of, for example, 0.001 Ωmm to 0.5 Ωmm (more specifically, approximately 0.01 Ωmm to 0.1 Ωmm). Also, besides a silicon substrate of low resistance, the substrate 2 may instead be an SiC substrate of low resistance, a GaN substrate of low resistance, etc. The substrate 2 has a thickness, for example, of approximately 650 μm during a semiconductor process and is ground to not more than approximately 300 μm in a preliminary stage before being made into a chip. The substrate 2 is electrically connected to the source electrode 9.

In this preferred embodiment, the buffer layer 3 is constituted of a multilayer buffer layer in which a plurality of nitride semiconductor films are laminated. In this preferred embodiment, the buffer layer 3 is constituted of the first buffer layer (not shown) constituted of an AlN film in contact with the front surface of the substrate 2 and the second buffer layer (not shown) constituted of an AlN/AlGaN superlattice layer laminated on a front surface of the first buffer layer (front surface at an opposite side to a substrate 2 side). The film thickness of the first buffer layer is approximately 100 nm to 500 nm. The film thickness of the second buffer layer is approximately 500 nm to 2 μm. The buffer layer 3 may instead be constituted, for example, of a single film or a composite film of AlGaN or of an AlGaN/GaN superlattice film.

The first nitride semiconductor layer 4 constitutes the electron transit layer. In this preferred embodiment, the first nitride semiconductor layer 4 is constituted of a GaN layer and the thickness thereof is approximately 0.5 μm to 2 μm. Also, an impurity by which a region other than a front surface region is made semi-insulating may be introduced for the purpose of suppressing the leak current that flows through the first nitride semiconductor layer 4. In this case, the concentration of the impurity is preferably not less than $4 \times 10^{16}$ cm$^{-3}$. Also, the impurity is, for example, C or Fe.

The second nitride semiconductor layer 5 constitutes the electron supply layer. The second nitride semiconductor layer 5 is constituted of a nitride semiconductor with a larger bandgap than the first nitride semiconductor layer 4. Specifically, the second nitride semiconductor layer 5 is constituted of a nitride semiconductor with a higher Al composition than the first nitride semiconductor layer 4. In a nitride semiconductor, the higher the Al composition, the larger the bandgap. In this preferred embodiment, the second nitride semiconductor layer 5 is constituted of an $Al_xGa_{1-x}N$ layer (0<x≤1). The value of x is preferably 10% to 30% and more preferably 10% to 15%. The thickness of the second nitride semiconductor layer 5 is preferably 5 nm to 25 nm and more preferably 15 nm to 25 nm.

The first nitride semiconductor layer (electron transit layer) 4 and the second nitride semiconductor layer (electron supply layer) 5 are thus constituted of nitride semiconductors that differ in bandgap (Al composition) and a lattice mismatch occurs therebetween. Also, due to the spontaneous polarizations of the first nitride semiconductor layer 4 and the second nitride semiconductor layer 5 and the piezo polarization due to the lattice mismatch between the two, the energy level of the conduction band of the first nitride semiconductor layer 4 at the interface between the first nitride semiconductor layer 4 and the second nitride semiconductor layer 5 is made lower than the Fermi level. Thereby, inside the first nitride semiconductor layer 4, the two-dimensional electron gas (2DEG) 11 spreads at a position close to the interface between the first nitride semiconductor layer 4 and the second nitride semiconductor layer 5 (for example, at a distance of several Å from the interface).

The gate portion 20 includes the third nitride semiconductor layer (semiconductor gate layer) 21 of the ridge shape that is epitaxially grown on the second nitride semiconductor layer 5 and the gate electrode 22 that is formed on the third nitride semiconductor layer 21. In between the source contact hole 7 and the drain contact hole 8, the gate portion 20 is disposed biasedly toward the source contact hole 7.

The third nitride semiconductor layer 21 is constituted of a nitride semiconductor that is doped with an acceptor type impurity. More specifically, the third nitride semiconductor layer 21 is constituted of an $Al_yGa_{1-y}N$ (0≤y<1, y<x) layer that is doped with the acceptor type impurity. In this preferred embodiment, the third nitride semiconductor layer 21 is constituted of a GaN layer (p type GaN layer) that is doped with the acceptor type impurity. In this preferred embodiment, the lateral cross section of the third nitride semiconductor layer 21 has the rectangular shape that is long in the thickness direction.

The third nitride semiconductor layer 21 is provided to change the conduction band of the interface formed by the first nitride semiconductor layer 4 (electron transit layer) and the second nitride semiconductor layer 5 (electron supply layer) in the region directly below the gate portion 20 such that the two-dimensional gas 11 is not formed in the region directly below the gate portion 20 in the state in which the gate voltage is not applied.

In this preferred embodiment, the acceptor type impurity is Mg (magnesium). The acceptor type impurity may instead be Zn (zinc) or other acceptor type impurity besides Mg.

The film thickness of the third nitride semiconductor layer 21 is preferably greater than 100 nm and is more preferably not less than 110 nm. More preferably, the film thickness of the third nitride semiconductor layer 21 is not less than 110 nm and not more than 150 nm. The reason for this is because the positive direction maximum rated gate voltage can then be increased as has been described with the first preferred embodiment. Also, even more preferably, the film thickness of the third nitride semiconductor layer 21 is not less than 125 nm and not more than 150 nm. The reason for this is because the positive direction maximum rated gate voltage can then be increased further. In this preferred embodiment, the film thickness of the third nitride semiconductor layer 21 is approximately 110 nm.

The lateral cross section of the gate electrode 22 has a laterally long rectangular shape. The width of the gate electrode 22 is narrower than the width of the third nitride semiconductor layer 21. The gate electrode 22 is formed on the width intermediate portion of the upper surface of the third nitride semiconductor layer 21. Therefore, a step is formed between the upper surface of the gate electrode 22 and the upper surface of one side portion of the third nitride semiconductor layer 21 and a step is formed between the upper surface of the gate electrode 22 and the upper surface of the other side portion of the third nitride semiconductor layer 21. Also, in plan view, both side edges of the gate electrode 22 are receded further inward than the corresponding side edges of the third nitride semiconductor layer 21.

A region of the third nitride semiconductor layer 21 upper surface between one side edge of the gate electrode and the corresponding side edge of the third nitride semiconductor layer 21 shall be referred to as a first ledge 21a. Also, a region of the third nitride semiconductor layer 21 upper surface between the other side edge of the gate electrode 22 and a corresponding side edge of the first ledge 21a shall be referred to as a second ledge 21b. When such ledges 21a and 21b are provided, distances between lower edges at both sides of the gate electrode 22 and upper edges of the corresponding side edges of the third nitride semiconductor layer 21 are increased in comparison to a case where a ledge is not provided and therefore, a gate leak current flowing from the gate electrode 22 to the source electrode 9 through the surfaces of the third nitride semiconductor layer 21 can be reduced.

If a width of the first ledge 21a is a first ledge width L1 and a width of the second ledge 21b is a second ledge width L2, at least one of either of the first ledge width L1 and the second ledge width L2 is preferably not less than 5 nm and not more than 110 nm and more preferably not less than 5 nm and not more than 55 nm.

Also, preferably, at least one of either of the first ledge width L1 and the second ledge width L2 is set such as to become smaller as the film thickness of the third nitride semiconductor layer 21 becomes thicker.

Specifically, if the film thickness of the third nitride semiconductor layer 21 is t [nm], preferably, at least one width $L_i$ (i=1 or 2) of either of the first ledge width L1 [nm] and the second ledge width L2 [nm] satisfies the condition of the following formula (1).

$$5 \le L_i \le 55 \cdot [1 - \{(t - 100)/200\}] \tag{1}$$

According to the formula (1), when t=100 [nm], an upper limit value of $L_i$ is 55 [nm], when t=110 [nm], the upper limit value of $L_i$ is 52.25 [nm], when t=120 [nm], the upper limit value of $L_i$ is 49.5 [nm], when t=130 [nm], the upper limit value of $L_i$ is 46.8 [nm], when t=140 [nm], the upper limit value of $L_i$ is 44 [nm], and when t=150 [nm], the upper limit value of $L_i$ is 41.25 [nm].

Also, if a sum of the first ledge width L1 and the second ledge width L2 is a total ledge width L, the total ledge width L is preferably not less than 10 nm and not more than 220 nm and more preferably not less than 10 nm and not more than 110 nm.

Also, preferably, the total ledge width L is set such as to become smaller as the film thickness of the third nitride semiconductor layer 21 becomes thicker.

Specifically, if the film thickness of the third nitride semiconductor layer 21 is t [nm], the total ledge width L [nm] preferably satisfies the condition of the following formula (2).

$$10 \le L \le 110 \cdot [1 - \{(t - 100)/200\}] \tag{2}$$

According to the formula (2), when t=100 [nm], an upper limit value of L is 110 [nm], when t=110 [nm], the upper limit value of L is 104.5 [nm], when t=120 [nm], the upper limit value of L is 99 [nm], when t=130 [nm], the upper limit value of L is 93.5 [nm], when t=140 [nm], the upper limit value of L is 88 [nm], and when t=150 [nm], the upper limit value of L is 82.5 [nm].

The reason for the above shall now be described.

In this present preferred embodiment, the film thickness of the third nitride semiconductor layer 21 is set to be thicker than 100 nm to increase the positive direction maximum rated gate voltage. Also, in this preferred embodiment, the ledges 21a and 21b are provided on the third nitride semiconductor layer 21 upper surface to reduce the gate leak current. If the widths of the ledges 21a and 21b are too large, voltages applied to both side portions of the third nitride semiconductor layer 21 become insufficient and therefore, a channel resistance (to be more accurate, a resistance of the two-dimensional gas directly below the third nitride semiconductor layer 21) may become high and the threshold voltage Vth may become high.

Figure 15:
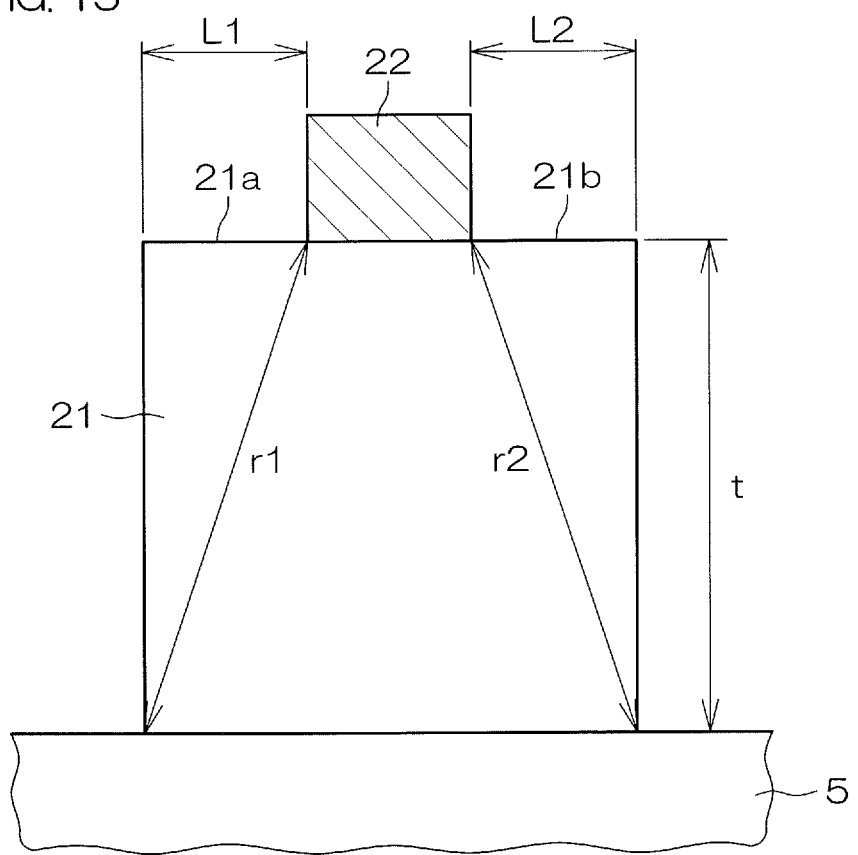
FIG. 15 is a partial sectional view for describing a reason why the threshold voltage Vth becomes high when a ledge width is too large.

This point shall now be described. If, for example as shown in FIG. 15, distances from lower ends of the side surfaces of the gate electrode 22 to lower ends of corresponding side surfaces of the third nitride semiconductor layer 21 are r1 and r2, the distances r1 and r2 increase as the ledge widths L1 and L2 increase. In FIG. 15, a ratio of the width of the gate electrode 22 with respect to the width of the third nitride semiconductor layer 21 is drawn smaller than it is in FIG. 14.

Thus, as the ledge widths L1 and L2 increase, electric field intensities at lower portions of both sides of the third nitride semiconductor layer 21 decrease and therefore, the formation of the two-dimensional gas becomes insufficient and the channel resistance becomes high.

Thus, by restricting at least one of either of the first ledge width L1 and the second ledge width L2 or the total ledge width L to ranges such as those mentioned above, increase in the channel resistance is suppressed and increase in the threshold voltage Vth is thereby suppressed.

The effects obtained by restricting the range of the ledge width L (L1, L2) are greater with an item of low withstand voltage of not more than 330 V because an overall contribution ratio of the channel resistance is higher in this case. The nitride semiconductor device 1G according to this preferred embodiment is thus preferably applied to a low withstand voltage item with which a distance from a side edge of the third nitride semiconductor layer 21 at the drain electrode 10 side to the drain electrode 10 (hereinafter referred to as the "gate-drain distance Lgd") is comparatively small. From such a standpoint, the gate-drain distance Lgd (see FIG. 14) is preferably not more than 10 μm and more preferably not more than 5 μm.

Also, at least one width $L_i$ (i=1 or 2) [nm] of either of the first ledge width L1 and the second ledge width L2 may be set to satisfy the condition of the following formula (3).

$$t/12 < L_i < t/2 \quad (3)$$

Also, the total ledge width L [nm] may be set to satisfy the condition of the following formula (4).

$$t/6 < L < t \quad (4)$$

In this preferred embodiment, the gate electrode 22 is in Schottky contact with the upper surface of the third nitride semiconductor layer 21. The gate electrode 22 is constituted of TiN. The gate electrode 22 may be constituted of a single film that is any one of a Ti film, a TiN film, and a TiW film or of a composite film constituted of any combination of two or more of the films.

The film thickness of the gate electrode 22 is 30 nm to 160 nm. The film thickness of the gate electrode 22 is preferably not more than 150 nm and more preferably not more than 50 nm. The reason for this is as follows. In a process of manufacturing the nitride semiconductor device 1G, an insulating film ($SiO_2$ film 84) is formed on both side surfaces of the gate electrode 22 (see FIG. 16D and FIG. 16E described below). If, in this process, the film thickness of the gate electrode 22 is too thick, it becomes difficult to form the insulating film appropriately on entire both side surfaces of the gate electrode 22. If the film thickness of the gate electrode 22 is not more than 150 nm, the insulating film can be formed appropriately on both side surfaces of the gate electrode 22.

The passivation film 6 covers the front surface of the second nitride semiconductor layer 5 (with the exception of the regions facing the contact holes 7 and 8) and the side surfaces and the front surface of the gate portion 20. The film thickness of the passivation film 6 is approximately 50 nm to 200 nm. In this preferred embodiment, the passivation film 6 is constituted of an SiN film. The passivation film 6 may instead be constituted of a single film that is any one of an SiN film, an $SiO_2$ film, an SiON film, an $Al_2O_3$ film, an AlN film, and an AlON film or of a composite film constituted of any combination of two or more of the films.

The barrier metal film 12 is formed selectively on the passivation film 6. In this preferred embodiment, the barrier metal film 12 is constituted of a TiN film and a thickness thereof is approximately 50 nm. The barrier metal film 12 is provided to prevent the metal materials constituting the source electrode 9 and the drain electrode 10 from diffusing into the passivation film 6.

The source electrode 9 and the drain electrode 10 are constituted, for example, of the first metal layers (ohmic metal layers) that are in ohmic contact with the second nitride semiconductor layer 5, the second metal layers (main electrode metal layers) that are laminated on the first metal layers, the third metal layers (adhesion layers) that are laminated on the second metal layers, and the fourth metal layers (barrier metal layers) that are laminated on the third metal layers. The first metal layers are, for example, Ti layers with thicknesses of approximately 10 nm to 20 nm. The second metal layers are, for example, AlCu layers with thicknesses of approximately 100 nm to 300 nm. The third metal layers are, for example, Ti layers with thicknesses of approximately 10 nm to 20 nm. The fourth metal layers are, for example, TiN layers with thicknesses of approximately 10 nm to 50 nm.

In the nitride semiconductor device 1G, a heterojunction is formed by there being formed on the first nitride semiconductor layer 4 (electron transit layer), the second nitride semiconductor layer 5 (electron supply layer) that differs in bandgap (Al composition). The two-dimensional electron gas 11 is thereby formed inside the first nitride semiconductor layer 4 near the interface between the first nitride semiconductor layer 4 and the second nitride semiconductor layer 5, and an HEMT making use of the two-dimensional electron gas 11 as the channel is formed. The gate electrode 22 faces the second nitride semiconductor layer 5 across the third nitride semiconductor layer 21.

Below the gate electrode 22, the energy levels of the first nitride semiconductor layer 4 and the second nitride semiconductor layer 5 are pulled up by the ionized acceptors contained in the third nitride semiconductor layer 21 that is constituted of the p type GaN layer. The energy level of the conduction band at the heterojunction interface between the first nitride semiconductor layer 4 and the second nitride semiconductor layer 5 is thus made higher than the Fermi level. Therefore, the two-dimensional electron gas 11 formed by the spontaneous polarizations of the first nitride semiconductor layer 4 and the second nitride semiconductor layer 5 and the piezo polarization due to the lattice mismatch of the two layers is not formed directly below the gate electrode 22 (gate portion 20).

Therefore, when a bias is not applied to the gate electrode 22 (zero bias state), the channel due to the two-dimensional electron gas 11 is interrupted directly below the gate electrode 22. A normally-off type HEMT is thus realized. When an appropriate on voltage (for example, of 5 V) is applied to the gate electrode 22, a channel is induced inside the first nitride semiconductor layer 4 directly below the gate electrode 22 and the two-dimensional electron gas 11 at both sides of the gate electrode 22 becomes connected. The source and the drain are thereby made continuous to each other.

For use, for example, a predetermined voltage (for example, of 50 V to 100 V) with which the drain electrode 10 side becomes positive is applied between the source electrode 9 and the drain electrode 10. In this state, the off voltage (0 V) or the on voltage (5 V) is applied to the gate electrode 22 with the source electrode 9 being at the reference potential (0 V).

If the on resistance is $R_{ON}$ and the gate charge is $Q_G$, $R_{ON} \cdot Q_G$ is preferably not more than 150 [mΩnc] and is more preferably not more than 100 [mΩnc].

A rated gate-source voltage of the nitride semiconductor device 1G is not less than 8 V. A rated drain-source voltage of the nitride semiconductor device 1G is not more than 300 V.

FIG. 16A to FIG. 16K are sectional views for describing an example of the manufacturing process of the nitride semiconductor device 1G described above and show a cross-sectional structure at a plurality of stages in the manufacturing process.

Figure 16A:
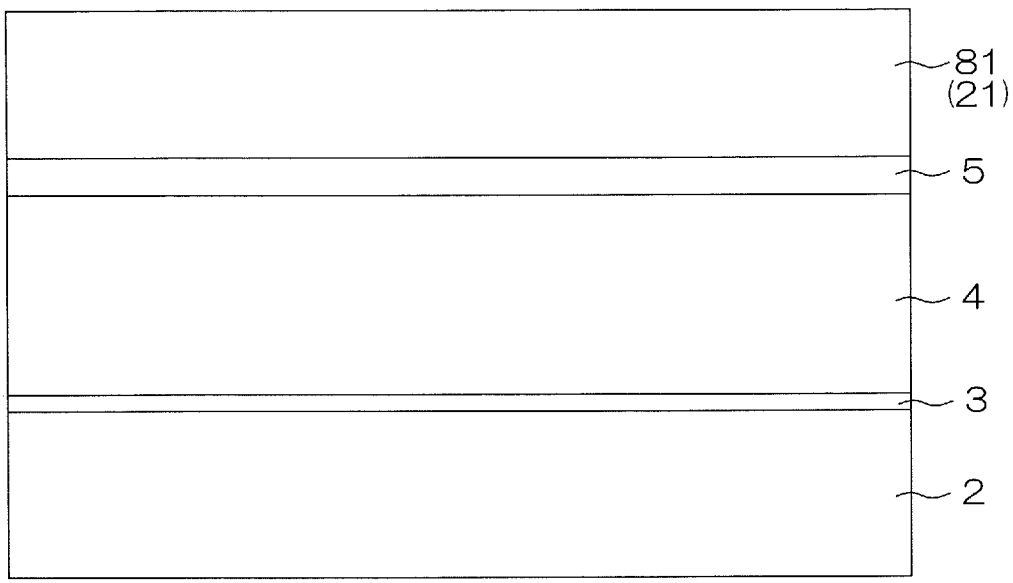
FIG. 16A is a sectional view of an example of a manufacturing process of the nitride semiconductor device of FIG. 14.

First, as shown in FIG. 16A, the buffer layer 3, the first nitride semiconductor layer (electron transit layer) 4, and the second nitride semiconductor layer (electron supply layer) 5 are epitaxially grown on the substrate 2 by an MOCVD (metal organic chemical vapor deposition) method. Further, a third semiconductor material film 81 that is a material film of the third nitride semiconductor layer 21 is epitaxially grown on the second nitride semiconductor layer 5 by the MOCVD method.

Figure 16B:
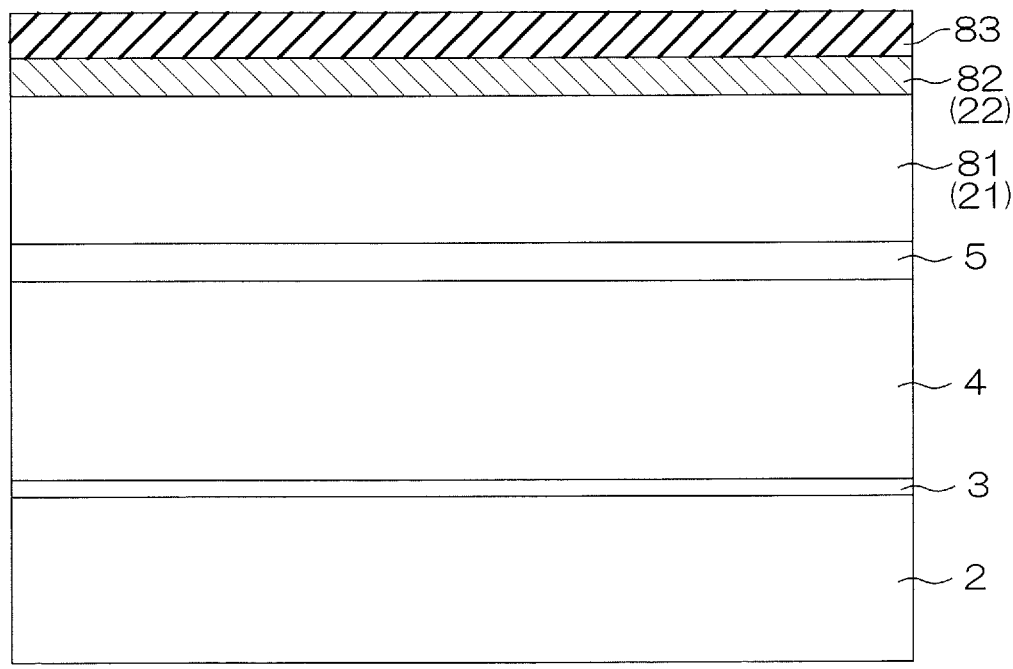
FIG. 16B is a sectional view of a step subsequent to that of FIG. 16A.

Next, as shown in FIG. 16B, a gate electrode film 82 that is a material film of the gate electrode 22 is formed, for example, by a sputtering method such as to cover an entire front surface that is exposed. An SiN film 83 is then formed on the gate electrode film 82.

Figure 16C:
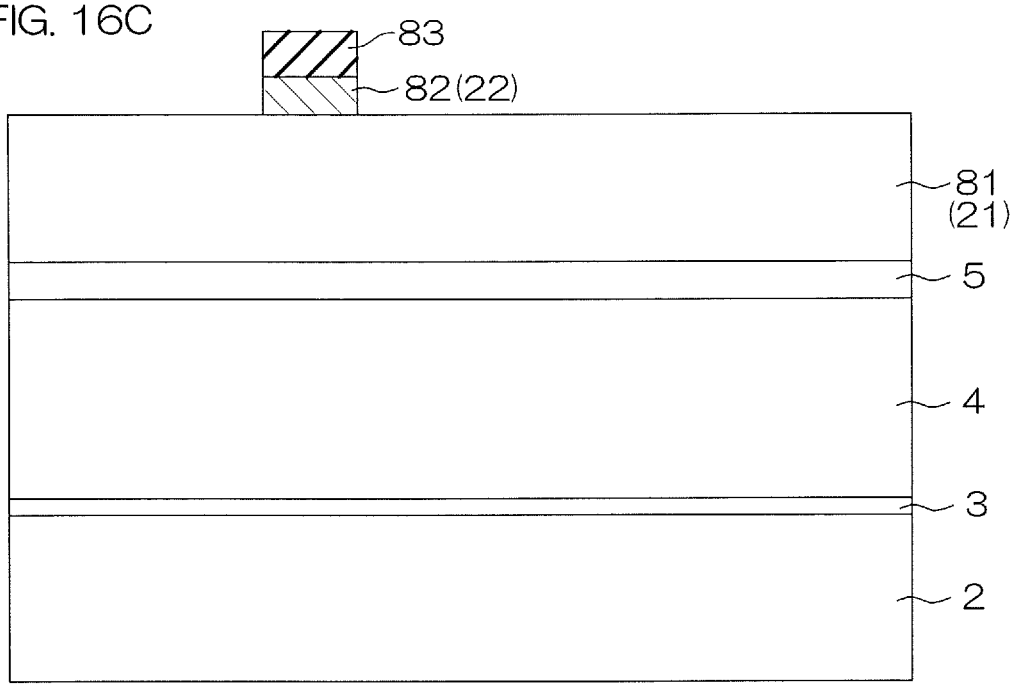
FIG. 16C is a sectional view of a step subsequent to that of FIG. 16B.

Next, as shown in FIG. 16C, for example, by dry etching, the SiN film 83 is selectively removed while leaving the SiN film 83 on a gate electrode preparation planned region of the gate electrode film 82 front surface. The gate electrode film 82 is then patterned by performing dry etching using the SiN film 83 as a mask. The gate electrode 22 is thereby formed.

Figure 16D:
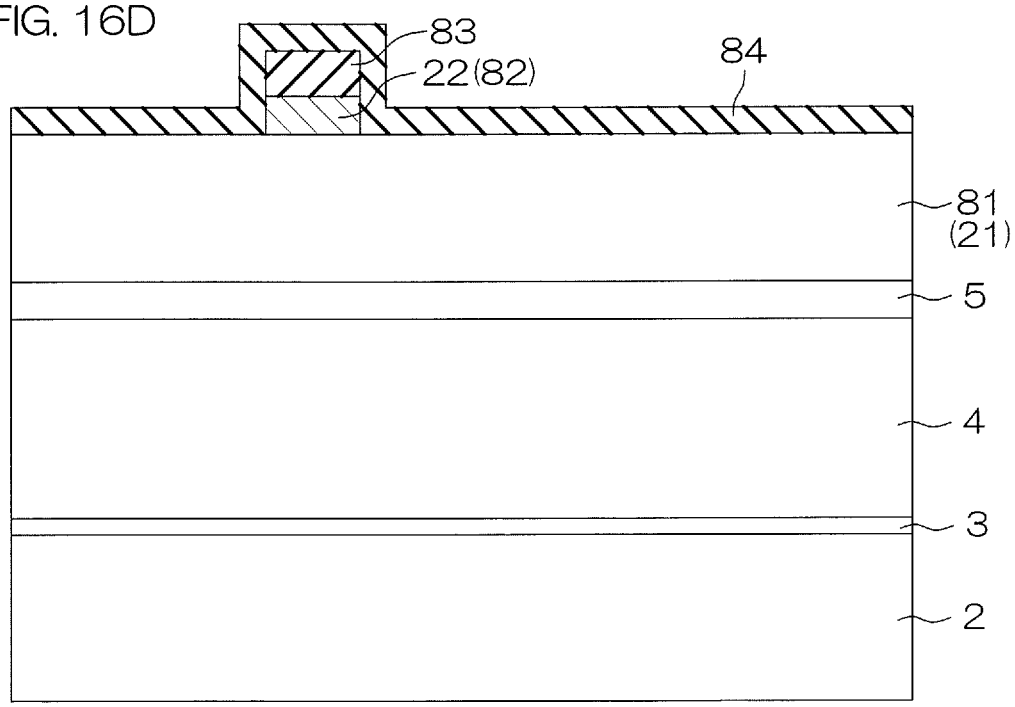
FIG. 16D is a sectional view of a step subsequent to that of FIG. 16C.

Next, as shown in FIG. 16D, an $SiO_2$ film 84 is formed, for example, by a plasma enhanced chemical vapor deposition method (PECVD method) such as to cover entire surfaces that are exposed.

Figure 16E:
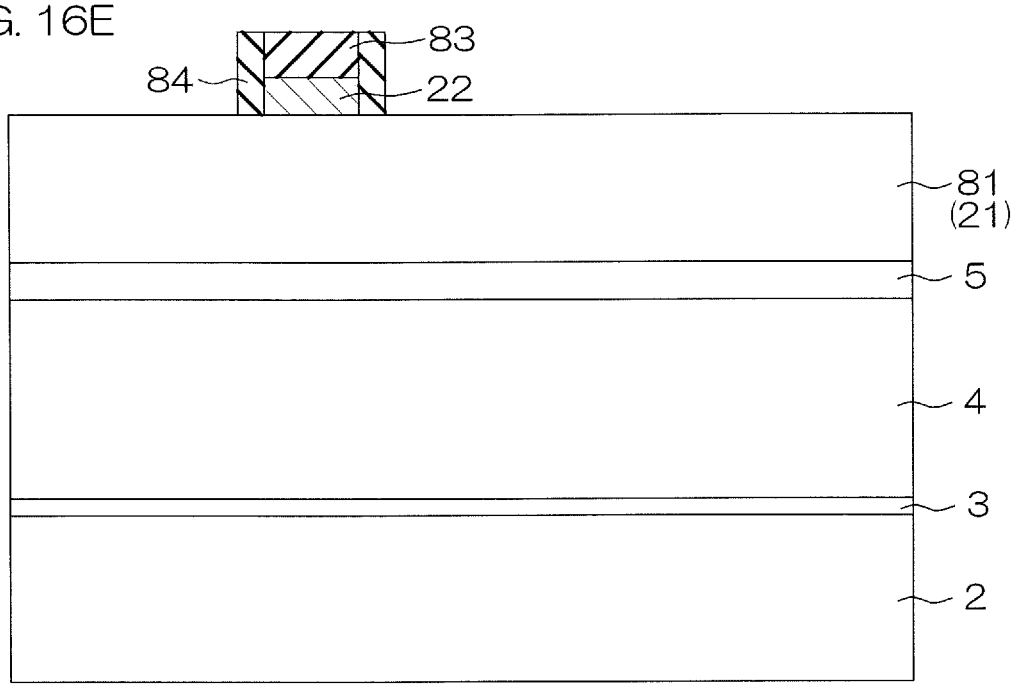
FIG. 16E is a sectional view of a step subsequent to that of FIG. 16D.

Next, as shown in FIG. 16E, for example, by dry etching, the $SiO_2$ film 84 is etched back such as to form the $SiO_2$ film 84 that covers the side surfaces of the gate electrode 22 and the SiN film 83.

Figure 16F:
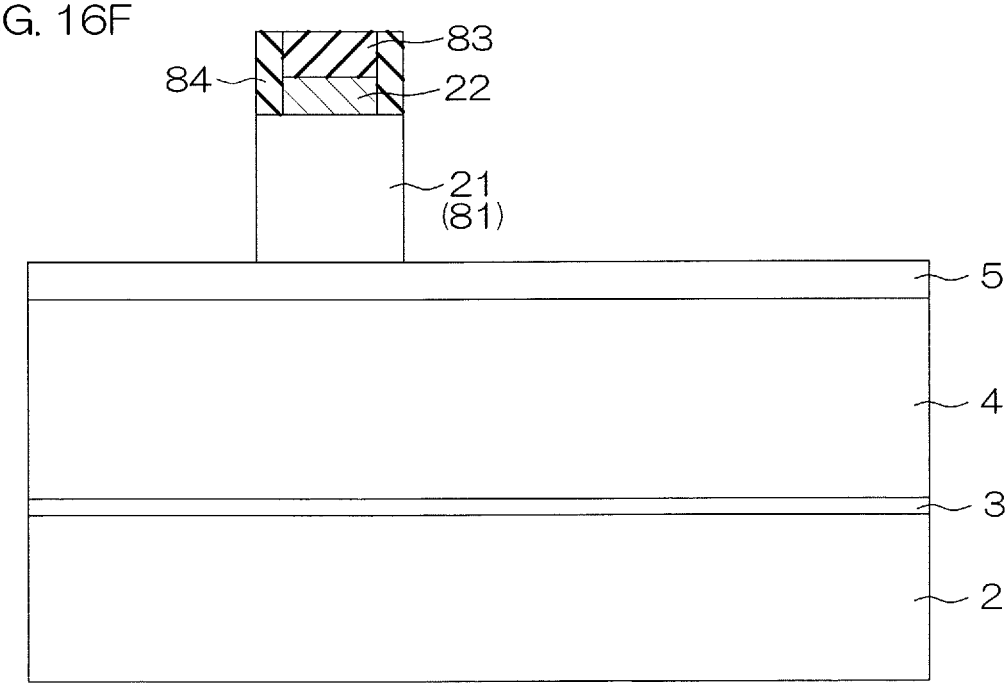
FIG. 16F is a sectional view of a step subsequent to that of FIG. 16E.

Next, as shown in FIG. 16F, the third semiconductor material film 81 is patterned by dry etching using the SiN film 83 and the $SiO_2$ film 84 as masks. The third nitride semiconductor layer 21 of the ridge shape is thereby obtained.

Figure 16G:
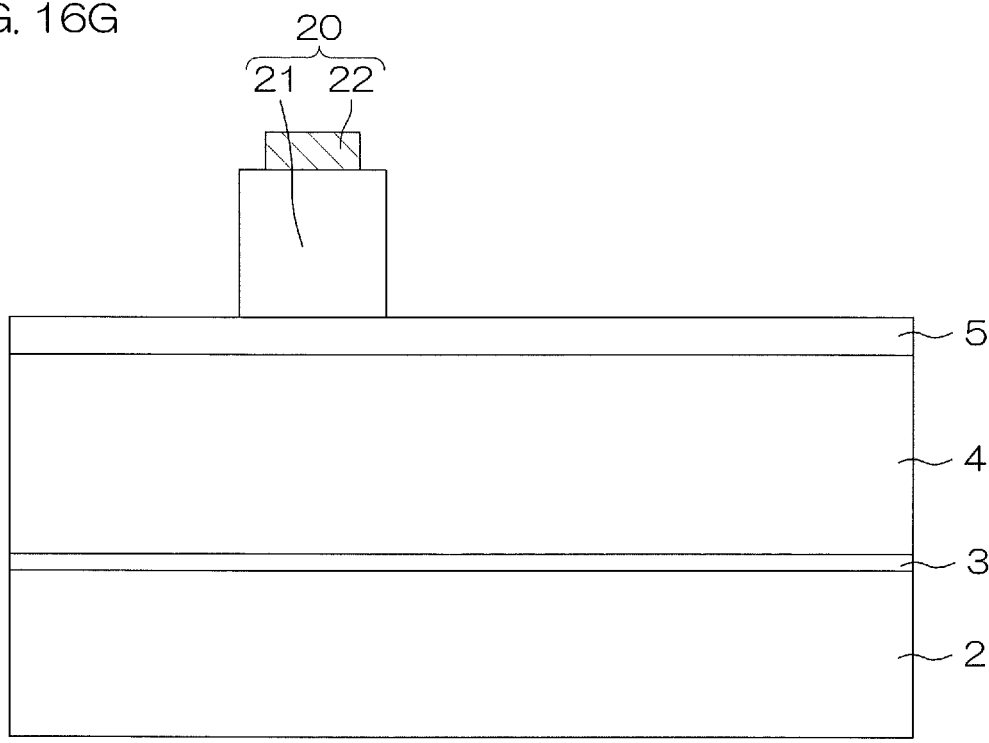
FIG. 16G is a sectional view of a step subsequent to that of FIG. 16F.

Next, as shown in FIG. 16G, the SiN film 83 and the $SiO_2$ film 84 are removed by wet etching. The gate portion 20 that is constituted of the third nitride semiconductor layer 21 of the ridge shape and the gate electrode 22 formed on the width intermediate portion of the upper surface of the third nitride semiconductor layer 21 is thereby formed.

Figure 16H:
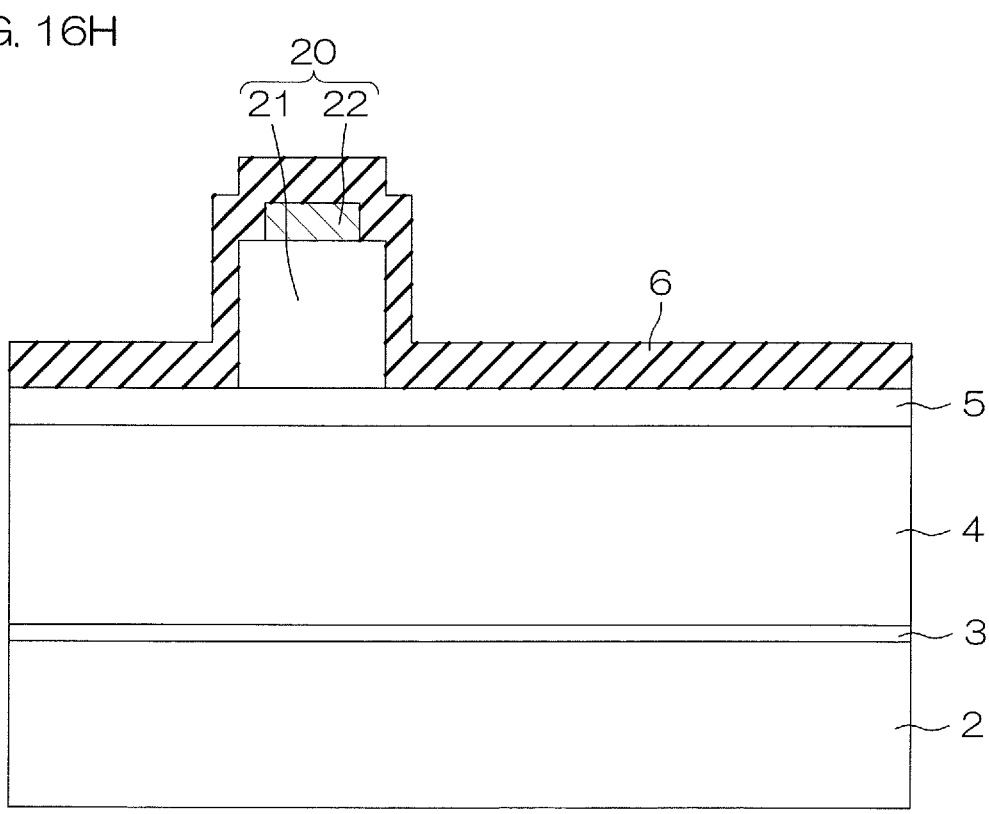
FIG. 16H is a sectional view of a step subsequent to that of FIG. 16G.
Figure 16:
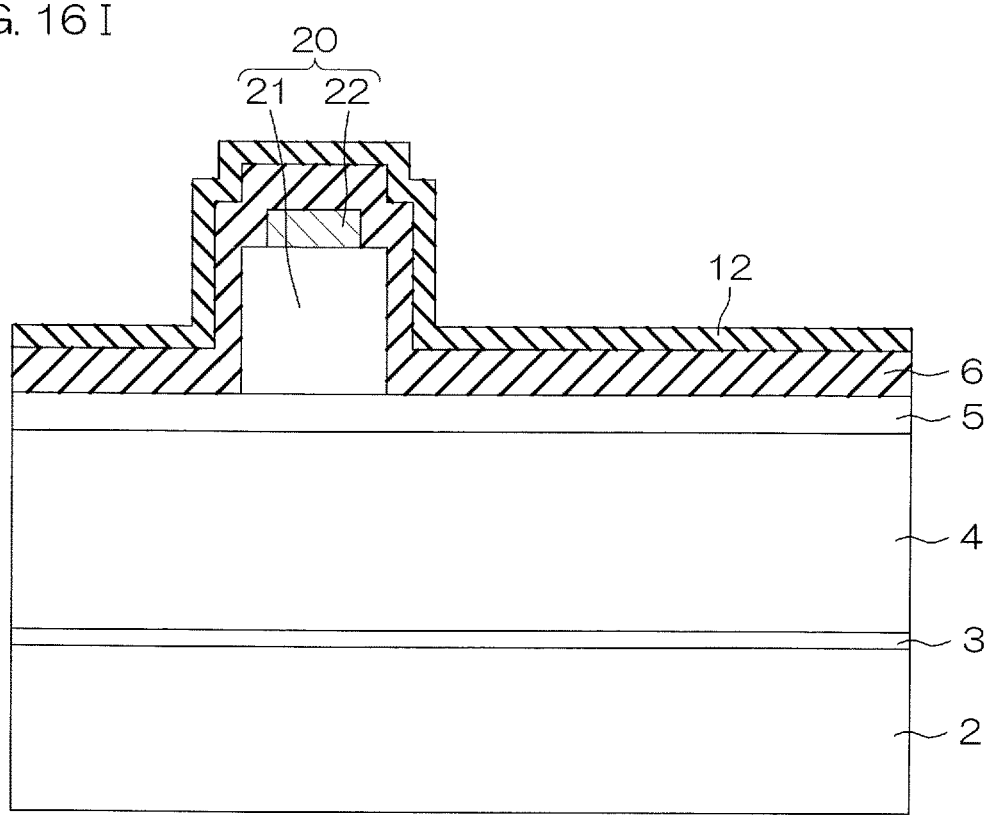
FIG. 16I is a sectional view of a step subsequent to that of FIG. 16H.
FIG. 16J is a sectional view of a step subsequent to that of FIG. 16I.
FIG. 16K is a sectional view of a step subsequent to that of FIG. 16J.
Figure 16:
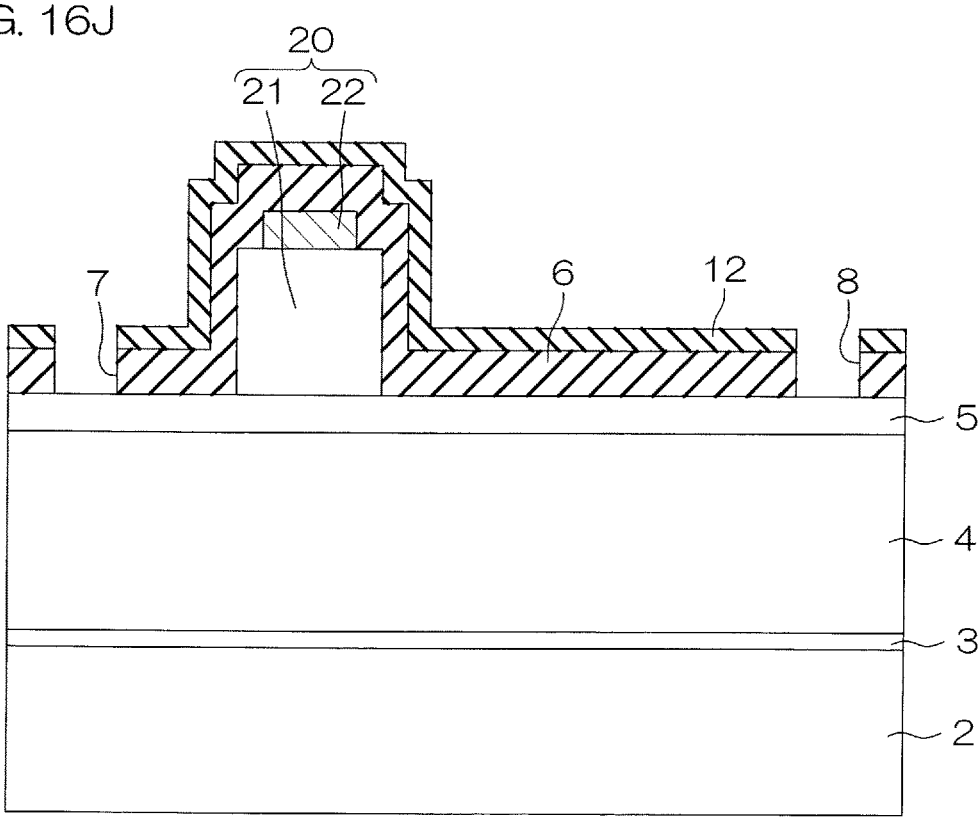

Next, as shown in FIG. 16H, the passivation film 6 is formed such as to cover entire surfaces that are exposed. The passivation film 6 is constituted, for example, of SiN.

Next, as shown in FIG. 16I, the barrier metal film 12 is formed on a front surface of the passivation film 6. The barrier metal film 12 is constituted, for example, of TiN.

Next, as shown in FIG. 16J, the source contact hole 7 and the drain contact hole 8 that reach to the second nitride semiconductor layer 5 are formed in the laminated film of the passivation film 6 and the barrier metal film 12.

Figure 16K:
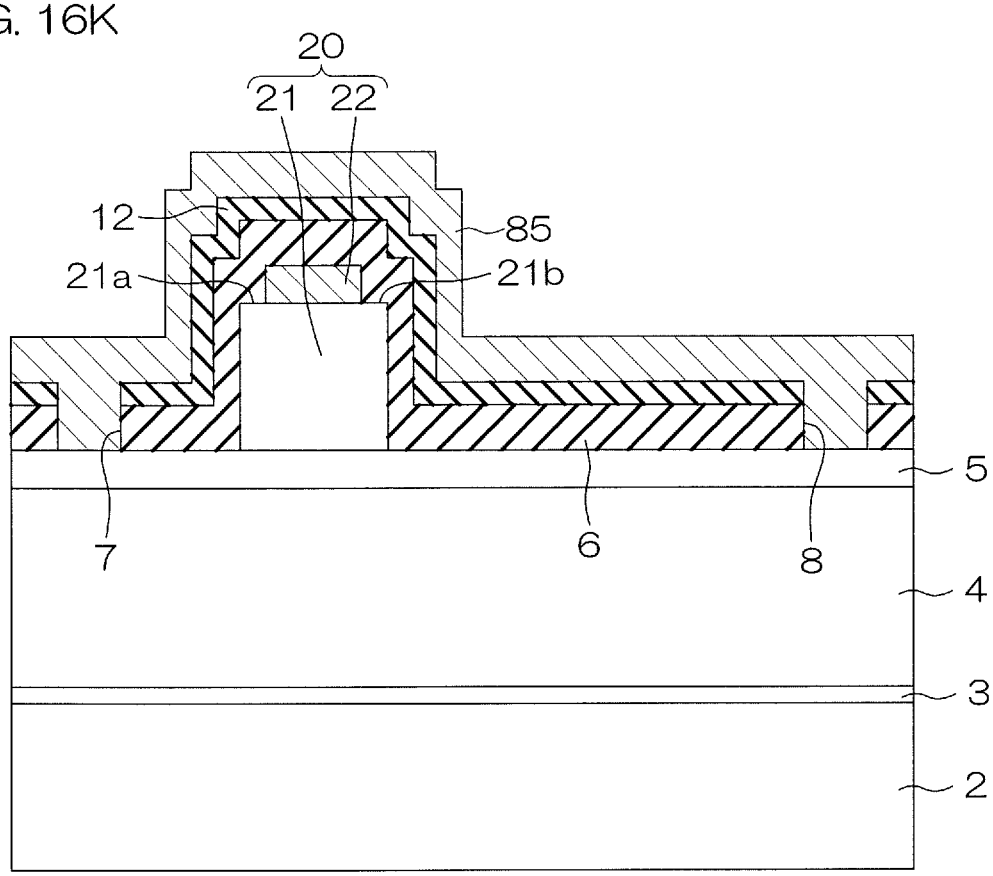

Next, as shown in FIG. 16K, a source/drain electrode film 85 is formed such as to cover entire surfaces that are exposed.

Lastly, the source/drain electrode film 85 and the barrier metal film 12 are patterned by photolithography and etching to form the source electrode 9 and the drain electrode 10 that are in contact with the second nitride semiconductor layer 5. The nitride semiconductor device 1G with the structure such as shown in FIG. 14 is thereby obtained.

Although the first to eighth preferred embodiments of the present invention have been described above, the present invention may be implemented in yet other preferred embodiments.

For example, the film thickness of the second nitride semiconductor layer 5 that is present directly below the source electrode 9 and the drain electrode 10 may be formed to be thin in comparison to the film thickness of the second nitride semiconductor layer 5 in other regions.

Also, Si may be contained in the second nitride semiconductor layer 5 that is present directly below the source electrode 9 and the drain electrode 10.

Also, although with each of the preferred embodiments described above, silicon was taken up as an example of the material of the substrate 2, any substrate material besides this, such as a sapphire substrate, a QST substrate, etc., may be applied.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2019-084320 filed on Apr. 25, 2019 in the Japan Patent Office and to Japanese Patent Application No. 2020-11739 filed on Jan. 28, 2020 in the Japan Patent Office, and the entire disclosures of these applications are incorporated herein by reference.

REFERENCE SIGNS LIST 1, 1A to 1G nitride semiconductor device
2 substrate
3 buffer layer
4 first nitride semiconductor layer
5 second nitride semiconductor layer
6 passivation film
7, 37 source contact hole
8, 38 drain contact hole
9 source electrode
10 drain electrode
11 two-dimensional electron gas (2DEG)
12 barrier metal film
20 gate portion
21 third nitride semiconductor layer
21A lower portion
21B upper portion
211 main body portion
212 upper protruding portion
22 gate electrode
23 fifth nitride semiconductor layer
24 fourth nitride semiconductor layer
25 sixth nitride semiconductor layer
31 groove
71, 81 third semiconductor material film
72, 82 gate electrode film
73 first $SiO_2$ film
74 second $SiO_2$ film
75, 85 source/drain electrode film
83 SiN film
84 $SiO_2$ film

The invention claimed is:
1. A nitride semiconductor device comprising:
a first nitride semiconductor layer that constitutes an electron transit layer;
a second nitride semiconductor layer that is formed on the first nitride semiconductor layer, is larger in bandgap than the first nitride semiconductor layer, and constitutes an electron supply layer;
a gate portion that is formed on the second nitride semiconductor layer; and
a source electrode and a drain electrode that, on the second nitride semiconductor layer, are opposingly disposed across the gate portion, wherein
the gate portion includes
a third nitride semiconductor layer of a ridge shape that is formed on the second nitride semiconductor layer and contains an acceptor type impurity, and
a gate electrode that is formed on the third nitride semiconductor layer, a film thickness of the third nitride semiconductor layer is greater than 100 nm, an average concentration of the acceptor type impurity in a thickness direction upper half portion of the third nitride semiconductor layer is not less than $1\times10^{19}$ cm$^{-3}$, a peak value of the acceptor type impurity in the thickness direction lower half portion of the third nitride semiconductor layer is not more than $4\times10^{19}$ cm$^{-3}$, and the third nitride semiconductor layer in a thickness direction includes
- a first region that is a surface layer region on the second nitride semiconductor layer side and in which an acceptor type impurity concentration is zero, and
- a second region that is continuous with the first region and in which the acceptor type impurity concentration increases from the first region toward the gate electrode side.

2. The nitride semiconductor device according to claim 1, wherein a gate voltage of +8 V is within a guaranteed voltage range.

3. The nitride semiconductor device according to claim 1, wherein an average concentration of the acceptor type impurity in the thickness direction upper half portion of the third nitride semiconductor layer is not more than $3\times10^{19}$ cm$^{-3}$.

4. The nitride semiconductor device according to claim 1, wherein in the thickness direction upper half portion of the third nitride semiconductor layer, there is a changing point at which a concentration of the acceptor type impurity decreases from a deep position side toward a shallower position side of the third nitride semiconductor layer and the changing point is within a range of down to a depth position of 20 nm from a front surface of the third nitride semiconductor layer.

5. The nitride semiconductor device according to claim 1, wherein the film thickness of the third nitride semiconductor layer is not less than 110 nm and not more than 150 nm.

6. The nitride semiconductor device according to claim 1, wherein
the first nitride semiconductor layer is constituted of a GaN layer,
the second nitride semiconductor layer is constituted of an $Al_xGa_{1-x}N$ ($0<x\leq1$) layer, and
the third nitride semiconductor layer is constituted of an $Al_yGa_{1-y}N$ ($0\leq y<1$, $y<x$) layer.

7. The nitride semiconductor device according to claim 1, wherein the acceptor type impurity is Mg or Zn.

8. The nitride semiconductor device according to claim 1, wherein a film thickness of the second nitride semiconductor layer is not less than 15 nm.

9. The nitride semiconductor device according to claim 1, wherein a film thickness of the second nitride semiconductor layer that is present directly below the source electrode and the drain electrode is thin in comparison to the film thickness of the second nitride semiconductor layer in other regions.

10. The nitride semiconductor device according to claim 1, wherein Si is contained in the second nitride semiconductor layer that is present directly below the source electrode and the drain electrode.

11. The nitride semiconductor device according to claim 1, wherein the gate electrode is in Schottky contact with the third nitride semiconductor layer.

12. The nitride semiconductor device according to claim 1, wherein a fourth nitride semiconductor layer that is larger in bandgap than the third nitride semiconductor layer is formed on the third nitride semiconductor layer, and
the gate electrode is formed on the fourth nitride semiconductor layer.

13. The nitride semiconductor device according to claim 12, wherein the gate electrode is in Schottky contact with the fourth nitride semiconductor layer.

14. The nitride semiconductor device according to claim 1, wherein in plan view, both side edges of the gate electrode are receded further inward than corresponding side edges of the third nitride semiconductor layer.

15. The nitride semiconductor device according to claim 1, wherein
the third nitride semiconductor layer is constituted of a main body portion that is formed on the second nitride semiconductor layer and an upper protruding portion that is formed on a width intermediate portion of an upper surface of the main body portion, and
the gate electrode is present above a top surface of the upper protruding portion.

16. The nitride semiconductor device according to claim 1, wherein if an on resistance is $R_{ON}$ and a gate charge is $Q_G$, $R_{ON} \cdot Q_G$ is not more than 150 [mΩnc].

17. The nitride semiconductor device according to claim 1, wherein a threshold voltage is not less than 1 V.

18. A nitride semiconductor device comprising:
a first nitride semiconductor layer that constitutes an electron transit layer;
a second nitride semiconductor layer that is formed on the first nitride semiconductor layer, is larger in bandgap than the first nitride semiconductor layer, and constitutes an electron supply layer;
a gate portion that is formed on the second nitride semiconductor layer; and
a source electrode and a drain electrode that, on the second nitride semiconductor layer, are opposingly disposed across the gate portion, wherein
the gate portion includes
a third nitride semiconductor layer of a ridge shape that is formed on the second nitride semiconductor layer and contains an acceptor type impurity, and
a gate electrode that is formed on the third nitride semiconductor layer,
a film thickness of the third nitride semiconductor layer is greater than 100 nm, and
in a thickness direction, the third nitride semiconductor layer includes
a first region that is a surface layer region on the second nitride semiconductor layer side and in which an acceptor type impurity concentration is zero, and
a second region that is continuous with the first region and in which the acceptor type impurity concentration increases from the first region toward the gate electrode side.

19. The nitride semiconductor device according to claim 18, wherein
in a thickness direction upper half portion of the third nitride semiconductor layer, there is a changing point at which a concentration of the acceptor type impurity decreases from a deep position side toward a shallower position side of the third nitride semiconductor layer, and
the changing point is within a range of down to a depth position of 20 nm from a front surface of the third nitride semiconductor layer.

20. The nitride semiconductor device according to claim 18, wherein a peak value of the acceptor type impurity in a thickness direction lower half portion of the third nitride semiconductor layer is not more than $4\times10^{19}$ cm$^{-3}$.

\* \* \* \* \*